United States Patent
Kim et al.

(10) Patent No.: US 10,809,830 B2
(45) Date of Patent: Oct. 20, 2020

(54) TOUCH INPUT DEVICE INCLUDING DISPLAY PANEL FORMED WITH STRAIN GAUGE AND DISPLAY PANEL FORMED WITH STRAIN GAUGE FORMING METHOD

(71) Applicant: HiDeep Inc., Gyeonggi-do (KR)

(72) Inventors: Yunjoung Kim, Gyeonggi-do (KR); Bonkee Kim, Gyeonggi-do (KR); Youngho Cho, Gyeonggi-do (KR); Seyeob Kim, Gyeonggi-do (KR)

(73) Assignee: HIDEEP, INC. (KR)

( * ) Notice: Subject to any disclaimer, the term of this patent is extended or adjusted under 35 U.S.C. 154(b) by 0 days.

(21) Appl. No.: 15/671,698

(22) Filed: Aug. 8, 2017

(65) Prior Publication Data

US 2018/0059839 A1    Mar. 1, 2018

(30) Foreign Application Priority Data

Aug. 26, 2016  (KR) .................. 10-2016-0109219
Apr. 11, 2017  (KR) .................. 10-2017-0046669

(51) Int. Cl.
| | |
|---|---|
| G06F 3/041 | (2006.01) |
| G01L 1/20 | (2006.01) |
| G01L 1/22 | (2006.01) |
| G06F 3/044 | (2006.01) |
| H01L 27/32 | (2006.01) |
| H01L 51/52 | (2006.01) |
| G02F 1/1333 | (2006.01) |
| G02F 1/1335 | (2006.01) |

(52) U.S. Cl.
CPC ............ *G06F 3/0412* (2013.01); *G01L 1/205* (2013.01); *G01L 1/2281* (2013.01); *G01L 1/2287* (2013.01); *G06F 3/041* (2013.01); *G06F 3/044* (2013.01); *H01L 27/323* (2013.01); *H01L 51/5284* (2013.01); *G02F 1/13338* (2013.01); *G02F 1/133512* (2013.01); *G06F 2203/04105* (2013.01)

(58) Field of Classification Search
CPC .............. G01L 1/2287; G02F 1/13338; G02F 1/133512
See application file for complete search history.

(56) References Cited

U.S. PATENT DOCUMENTS

| | | | | |
|---|---|---|---|---|
| 2013/0018489 A1* | 1/2013 | Grunthaner | ............. | G06F 3/041 700/73 |
| 2013/0082970 A1* | 4/2013 | Frey | ..................... | G06F 3/0414 345/173 |
| 2013/0135244 A1* | 5/2013 | Lynch | .................. | G06F 3/0414 345/174 |

(Continued)

FOREIGN PATENT DOCUMENTS

| | | | |
|---|---|---|---|
| CN | 2016-1053162.5 | * | 7/2016 |
| KR | 10-2010-0019808 | | 2/2010 |

(Continued)

OTHER PUBLICATIONS

Korean Office Action dated May 24, 2018, 5 pages.

*Primary Examiner* — Chun-Nan Lin
(74) *Attorney, Agent, or Firm* — The Belles Group, P.C.

(57) ABSTRACT

A touch input device capable of detecting a touch force may be provided that includes a display panel on which a strain gauge is directly formed. The touch input device detects the touch force on the basis of a change of a resistance value of the strain gauge.

18 Claims, 17 Drawing Sheets

(56) References Cited

U.S. PATENT DOCUMENTS

| | | | |
|---|---|---|---|
| 2014/0300835 A1* | 10/2014 | Chu | G06F 3/0412 349/12 |
| 2015/0020610 A1* | 1/2015 | Hurst | G01L 1/146 73/862.68 |
| 2016/0103545 A1* | 4/2016 | Filiz | G01L 1/18 345/174 |
| 2017/0010742 A1* | 1/2017 | Liu | G06F 3/0416 |
| 2017/0075493 A1* | 3/2017 | Lee | G06F 3/0418 |
| 2017/0329448 A1* | 11/2017 | Li | G06F 3/0412 |
| 2018/0284915 A1* | 10/2018 | Kim | G06F 3/041 |

FOREIGN PATENT DOCUMENTS

| | | |
|---|---|---|
| KR | 10-2011-0119347 | 4/2011 |
| KR | 10-2012-0073140 | 7/2012 |
| KR | 10-2013-0106503 | 9/2013 |
| KR | 10-2014-0023428 A | 2/2014 |
| KR | 10-2015-0089363 A | 8/2015 |
| WO | 2013/009778 A1 | 1/2013 |

\* cited by examiner

TOUCH INPUT DEVICE INCLUDING DISPLAY PANEL FORMED WITH STRAIN GAUGE AND DISPLAY PANEL FORMED WITH STRAIN GAUGE FORMING METHOD

BACKGROUND

Field

The present disclosure relates to a touch input device including a display panel having a strain gauge formed therein and a method for manufacturing the display panel having a strain gauge formed therein and more particularly to a touch input device capable of detecting a touch force and a method for manufacturing the display panel for the same.

Description of the Related Art

Various kinds of input devices are being used to operate a computing system. For example, the input device includes a button, key, joystick and touch screen. Since the touch screen is easy and simple to operate, the touch screen is increasingly being used in operation of the computing system.

The touch screen may constitute a touch surface of a touch input device including a touch sensor panel which may be a transparent panel including a touch-sensitive surface. The touch sensor panel is attached to the front side of a display screen, and then the touch-sensitive surface may cover the visible side of the display screen. The touch screen allows a user to operate the computing system by simply touching the touch screen by a finger, etc. Generally, the computing system recognizes the touch and a position of the touch on the touch screen and analyzes the touch, and thus, performs the operations in accordance with the analysis.

Here, there is a demand for a touch input device capable of detecting not only the touch position according to the touch on the touch screen but a force magnitude of the touch without degrading the performance of a display module.

SUMMARY

One embodiment is a touch input device capable of detecting a touch force. The touch input device includes a display panel on which a strain gauge is directly formed. The touch force is detected on the basis of a change of a resistance value of the strain gauge.

The display panel may include a first substrate layer, a second substrate layer which is disposed under the first substrate layer, and a liquid crystal layer or an organic material layer which is disposed between the first substrate layer and the second substrate layer. The strain gauge may be formed on a bottom surface of the second substrate layer.

The display panel may further include a light shielding layer which is disposed under the second substrate layer on which the strain gauge has been formed.

The display panel may include a first substrate layer, a second substrate layer which is disposed under the first substrate layer, a liquid crystal layer or an organic material layer which is disposed between the first substrate layer and the second substrate layer, and a light shielding layer which is disposed under the second substrate layer. The strain gauge may be formed on a bottom surface of the light shielding layer.

The display panel may include a first substrate layer, a second substrate layer which is disposed under the first substrate layer, a liquid crystal layer or an organic material layer which is disposed between the first substrate layer and the second substrate layer, and a third substrate layer which is disposed under the second substrate layer. The strain gauge may be formed on a bottom surface of the third substrate layer.

The display panel may further include a light shielding layer which is disposed between the second substrate layer and the third substrate layer.

The display panel may further include a light shielding layer which is disposed under the third substrate layer.

The display panel may include a first substrate layer, a second substrate layer which is disposed under the first substrate layer, a liquid crystal layer or an organic material layer which is disposed between the first substrate layer and the second substrate layer, a third substrate layer which is disposed under the second substrate layer, and a light shielding layer which is disposed under the third substrate layer. The strain gauge may be formed on a bottom surface of the light shielding layer.

The third substrate layer may be relatively less bent than the first substrate layer, the liquid crystal layer or the organic material layer, and the second substrate layer.

The third substrate layer may have a light shielding function.

The strain gauge may be made of silicon.
The strain gauge may be made of metal.
The light shielding layer may be black ink.

The touch input device may further include a touch sensor which detects a touch position. The touch sensor may be positioned on the display panel or may be positioned inside the display panel.

The display panel may be an LCD panel.
The display panel may be an OLED panel.

Another embodiment is a method for manufacturing a display panel including a strain gauge, a first substrate layer, a second substrate layer which is disposed under the first substrate layer, and a liquid crystal layer or an organic material layer which is disposed between the first substrate layer and the second substrate layer. The method includes: a strain gauge forming step of forming the strain gauge on a bottom surface of the second substrate layer, which faces upward; a second substrate layer inverting step of inverting the second substrate layer on which the strain gauge has been formed; a liquid crystal layer or organic material layer forming step of forming the liquid crystal layer or the organic material layer on a top surface of the inverted second substrate layer; and a first substrate layer forming step of forming the first substrate layer on the liquid crystal layer or the organic material layer.

Further another embodiment is a method for manufacturing a display panel including a strain gauge, a first substrate layer, a second substrate layer which is disposed under the first substrate layer, and a liquid crystal layer or an organic material layer which is disposed between the first substrate layer and the second substrate layer. The method includes: a liquid crystal layer or organic material layer forming step of forming the liquid crystal layer or the organic material layer on a top surface of the second substrate layer; a first substrate layer forming step of forming the first substrate layer on the liquid crystal layer or the organic material layer; a display panel inverting step of inverting the display panel including the second substrate layer, the liquid crystal layer or the organic material layer, and the first substrate layer; and a strain gauge forming step of forming the strain gauge on a bottom surface of the second substrate layer, which faces upward.

Yet another embodiment is a method for manufacturing a display panel including a strain gauge, a light shielding layer, a first substrate layer, a second substrate layer which is disposed under the first substrate layer, and a liquid crystal layer or an organic material layer which is disposed between the first substrate layer and the second substrate layer. The method includes: a strain gauge forming step of forming the strain gauge on a bottom surface of the second substrate layer, which faces upward; a light shielding layer disposition step of disposing the light shielding layer under the second substrate layer which faces upward and on which the strain gauge has been formed; a light shielding layer and second substrate layer inverting step of inverting the light shielding layer and the second substrate layer on which the strain gauge has been formed; a liquid crystal layer or organic material layer forming step of forming the liquid crystal layer or the organic material layer on a top surface of the inverted second substrate layer; and a first substrate layer forming step of forming the first substrate layer on the liquid crystal layer or the organic material layer.

Still another embodiment is a method for manufacturing a display panel including a strain gauge, a light shielding layer, a first substrate layer, a second substrate layer which is disposed under the first substrate layer, and a liquid crystal layer or an organic material layer which is disposed between the first substrate layer and the second substrate layer. The method includes: a liquid crystal layer or organic material layer forming step of forming the liquid crystal layer or the organic material layer on a top surface of the second substrate layer; a first substrate layer forming step of forming the first substrate layer on the liquid crystal layer or the organic material layer; a panel inverting step of inverting the panel including the second substrate layer, the liquid crystal layer or the organic material layer, and the first substrate layer; a strain gauge forming step of forming the strain gauge on a bottom surface of the second substrate layer, which faces upward; and a light shielding layer disposition step of disposing the light shielding layer under the second substrate layer which faces upward and on which the strain gauge has been formed.

Still another embodiment is a method for manufacturing a display panel including a strain gauge, a light shielding layer, a first substrate layer, a second substrate layer which is disposed under the first substrate layer, and a liquid crystal layer or an organic material layer which is disposed between the first substrate layer and the second substrate layer. The method includes: a light shielding layer disposition step of disposing the light shielding layer under the second substrate layer which faces upward; a strain gauge forming step of forming the strain gauge on a bottom surface of the light shielding layer, which faces upward; a light shielding layer and second substrate layer inverting step of inverting the light shielding layer on which the strain gauge has been formed and the second substrate layer; a liquid crystal layer or organic material layer forming step of forming the liquid crystal layer or the organic material layer on a top surface of the inverted second substrate layer; and a first substrate layer forming step of forming the first substrate layer on the liquid crystal layer or the organic material layer.

Still another embodiment is a method for manufacturing a display panel including a strain gauge, a light shielding layer, a first substrate layer, a second substrate layer which is disposed under the first substrate layer, and a liquid crystal layer or an organic material layer which is disposed between the first substrate layer and the second substrate layer. The method includes: a liquid crystal layer or organic material layer forming step of forming the liquid crystal layer or the organic material layer on a top surface of the second substrate layer; a first substrate layer forming step of forming the first substrate layer on the liquid crystal layer or the organic material layer; a display panel inverting step of inverting the display panel including the second substrate layer, the liquid crystal layer or the organic material layer, and the first substrate layer; a light shielding layer disposition step of disposing the light shielding layer under the second substrate layer which faces upward; and a strain gauge forming step of forming the strain gauge on a bottom surface of the light shielding layer, which faces upward.

Still another embodiment is a method for manufacturing a display panel including a strain gauge, a first substrate layer, a second substrate layer which is disposed under the first substrate layer, a liquid crystal layer or an organic material layer which is disposed between the first substrate layer and the second substrate layer, and a third substrate layer which is disposed under the second substrate layer. The method includes: a strain gauge forming step of forming the strain gauge on a bottom surface of the third substrate layer, which faces upward; a third substrate layer inverting step of inverting the third substrate layer on which the strain gauge has been formed; and a panel disposition step of disposing the panel composed of the second substrate layer, the liquid crystal layer or the organic material layer, and the first substrate layer on the inverted third substrate layer.

Still another embodiment is a method for manufacturing a display panel including a strain gauge, a first substrate layer, a second substrate layer which is disposed under the first substrate layer, a liquid crystal layer or an organic material layer which is disposed between the first substrate layer and the second substrate layer, and a third substrate layer which is disposed under the second substrate layer. The method includes: a liquid crystal layer or organic material layer forming step of forming the liquid crystal layer or the organic material layer on a top surface of the second substrate layer; a first substrate layer forming step of forming the first substrate layer on the liquid crystal layer or the organic material layer; a panel inverting step of inverting the panel including the second substrate layer, the liquid crystal layer or the organic material layer, and the first substrate layer; a third substrate layer disposition step of disposing the third substrate layer under the inverted second substrate layer; and a strain gauge forming step of forming the strain gauge on a bottom surface of the third substrate layer, which faces upward.

Still another embodiment is a method for manufacturing a display panel including a strain gauge, a light shielding layer, a first substrate layer, a second substrate layer which is disposed under the first substrate layer, a liquid crystal layer or an organic material layer which is disposed between the first substrate layer and the second substrate layer, and a third substrate layer which is disposed under the second substrate layer. The method includes: a strain gauge forming step of forming the strain gauge on a bottom surface of the third substrate layer, which faces upward; a third substrate layer inverting step of inverting the third substrate layer on which the strain gauge has been formed; and a panel disposition step of disposing the panel composed of the light shielding layer, the second substrate layer, the liquid crystal layer or the organic material layer, and the first substrate layer on the inverted third substrate layer.

Still another embodiment is a method for manufacturing a display panel including a strain gauge, a light shielding layer, a first substrate layer, a second substrate layer which is disposed under the first substrate layer, a liquid crystal layer or an organic material layer which is disposed between the first substrate layer and the second substrate layer, and a third substrate layer which is disposed under the second substrate layer. The method includes: a strain gauge forming step of forming the strain gauge on a bottom surface of the third substrate layer, which faces upward; a third substrate layer inverting step of inverting the third substrate layer on which the strain gauge has been formed; a light shielding layer disposition step of disposing the light shielding layer on the inverted third substrate layer; and a panel disposition step of disposing the panel composed of the second substrate layer, the liquid crystal layer or the organic material layer, and the first substrate layer on the light shielding layer.

Still another embodiment is a method for manufacturing a display panel including a strain gauge, a light shielding layer, a first substrate layer, a second substrate layer which is disposed under the first substrate layer, a liquid crystal layer or an organic material layer which is disposed between the first substrate layer and the second substrate layer, and a third substrate layer which is disposed under the second substrate layer. The method includes: a liquid crystal layer or organic material layer forming step of forming the liquid crystal layer or the organic material layer on a top surface of the second substrate layer, which faces upward; a first substrate layer forming step of forming the first substrate layer on the liquid crystal layer or the organic material layer; a display panel inverting step of inverting the display panel including the second substrate layer, the liquid crystal layer or the organic material layer, and the first substrate layer; a light shielding layer disposition step of disposing the light shielding layer under the second substrate layer which faces upward; a third substrate layer disposition step of disposing the third substrate layer under the light shielding layer which faces upward; and a strain gauge forming step of forming the strain gauge on a bottom surface of the third substrate layer, which faces upward.

Still another embodiment is a method for manufacturing a display panel including a strain gauge, a light shielding layer, a first substrate layer, a second substrate layer which is disposed under the first substrate layer, a liquid crystal layer or an organic material layer which is disposed between the first substrate layer and the second substrate layer, and a third substrate layer which is disposed under the second substrate layer. The method includes: a strain gauge forming step of forming the strain gauge on a bottom surface of the third substrate layer, which faces upward; a light shielding layer disposition step of disposing the light shielding layer under the third substrate layer which faces upward and on which the strain gauge has been formed; a light shielding layer and third substrate layer inverting step of inverting the light shielding layer and the third substrate layer on which the strain gauge has been formed; and a panel disposition step of disposing the panel composed of the second substrate layer, the liquid crystal layer or the organic material layer, and the first substrate layer on the inverted third substrate layer.

Still another embodiment is a method for manufacturing a display panel including a strain gauge, a light shielding layer, a first substrate layer, a second substrate layer which is disposed under the first substrate layer, a liquid crystal layer or an organic material layer which is disposed between the first substrate layer and the second substrate layer, and a third substrate layer which is disposed under the second substrate layer. The method includes: a liquid crystal layer or organic material layer forming step of forming the liquid crystal layer or the organic material layer on a top surface of the second substrate layer; a first substrate layer forming step of forming the first substrate layer on the liquid crystal layer or the organic material layer; a panel inverting step of inverting the panel including the second substrate layer, the liquid crystal layer or the organic material layer, and the first substrate layer; a third substrate layer disposition step of disposing the third substrate layer under the inverted second substrate layer; a strain gauge forming step of forming the strain gauge on a bottom surface of the third substrate layer, which faces upward; and a light shielding layer disposition step of disposing the light shielding layer under the third substrate layer which faces upward and on which the strain gauge has been formed.

Still another embodiment is a method for manufacturing a display panel including a strain gauge, a light shielding layer, a first substrate layer, a second substrate layer which is disposed under the first substrate layer, a liquid crystal layer or an organic material layer which is disposed between the first substrate layer and the second substrate layer, and a third substrate layer which is disposed under the second substrate layer. The method includes: a light shielding layer disposition step of disposing the light shielding layer under the third substrate layer which faces upward; a strain gauge forming step of forming the strain gauge on a bottom surface of the light shielding layer, which faces upward; a light shielding layer and third substrate layer inverting step of inverting the light shielding layer on which the strain gauge has been formed and the third substrate layer; and a panel disposition step of disposing the panel composed of the second substrate layer, the liquid crystal layer or the organic material layer, and the first substrate layer on the inverted third substrate layer.

Still another embodiment is a method for manufacturing a display panel including a strain gauge, a light shielding layer, a first substrate layer, a second substrate layer which is disposed under the first substrate layer, a liquid crystal layer or an organic material layer which is disposed between the first substrate layer and the second substrate layer, and a third substrate layer which is disposed under the second substrate layer. The method includes: a liquid crystal layer or organic material layer forming step of forming the liquid crystal layer or the organic material layer on a top surface of the second substrate layer; a first substrate layer forming step of forming the first substrate layer on the liquid crystal layer or the organic material layer; a panel inverting step of inverting the panel including the second substrate layer, the liquid crystal layer or the organic material layer, and the first substrate layer; a third substrate layer disposition step of disposing the third substrate layer under the inverted second substrate layer; a light shielding layer disposition step of disposing the light shielding layer under the third substrate layer which faces upward; and a strain gauge forming step of forming the strain gauge on a bottom surface of the light shielding layer, which faces upward.

The strain gauge may detect a force applied to the display panel on the basis of a change of a resistance value of the strain gauge.

In the strain gauge forming step, the strain gauge may be formed by using any one of an etching process including photolithography, etching resist or etching paste.

In the strain gauge forming step, the strain gauge may be formed by using Gravure printing method.

The strain gauge forming step may include: forming a strain gauge pattern by injecting a strain gauge constituent material into a groove formed in a Gravure roll; transferring the strain gauge pattern to a blanket of a rotating transfer roll by rotating the Gravure roll; and transferring the strain gauge pattern transferred to the blanket of the transfer roll by rotating the transfer roll.

The strain gauge forming step may include: forming a strain gauge pattern in a groove formed in a Cliche plate by injecting a strain gauge constituent material into the groove; transferring the strain gauge pattern to a blanket of a transfer roll by rotating the transfer roll on the Cliche plate; and transferring the strain gauge pattern transferred to the blanket of the transfer roll by rotating the transfer roll.

The strain gauge forming step may include: processing a strain gauge pattern from a strain gauge constituent material layer coated on the entire outer surface of a blanket of a transfer roll by rotating the transfer roll on a Cliche plate including a protrusion; and transferring the processed strain gauge pattern to the blanket of the transfer roll by rotating the transfer roll.

In the strain gauge forming step, the strain gauge may be formed by using an inkjet printing method.

The strain gauge forming step may include: discharging a droplet through a nozzle and attaching the droplet; and drying a solvent of the attached droplet.

In the strain gauge forming step, the strain gauge may be formed by using a screen printing method.

The strain gauge forming step may include: placing a paste, that is, a strain gauge constituent material on a screen pulled with a predetermined tension, and moving a squeegee while pressing down the squeegee; and pushing and transferring the paste through a mesh of the screen.

The mesh may be made of stainless steel.

In the strain gauge forming step, the strain gauge may be formed by using a flexographic printing method.

The strain gauge forming step may include: applying ink, i.e., the strain gauge constituent material which is supplied from a supplier on an Anilox roller having a uniform grating; transferring the ink spread on a surface of the Anilox roller to a soft printing substrate mounted on a printing cylinder in an embossed pattern; and printing the ink transferred to the soft printing substrate on a surface which moves by the rotation of a hard printing roll.

In the strain gauge forming step, the strain gauge may be formed by using a transfer printing method.

The strain gauge forming step may include: coating ink, i.e., the strain gauge constituent material which is supplied from a supplier on a transparent endless belt; and transferring the ink coated on a surface of the transparent endless belt by using laser.

The strain gauge forming step may include: coating ink, i.e., the strain gauge constituent material which is supplied from a supplier on a transparent endless belt; and transferring the ink coated on a surface of the transparent endless belt by a heating element.

BRIEF DESCRIPTION OF THE DRAWINGS

FIG. 8 is a view for describing a method for forming the strain gauge on the second substrate layer by using a reverse offset printing method;

DETAILED DESCRIPTION

Figure 1A:
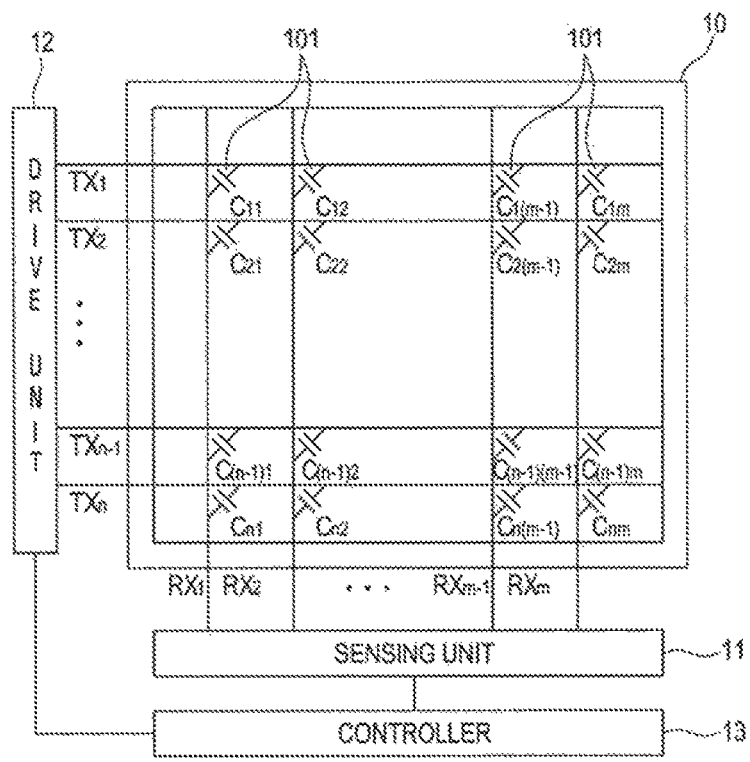
FIGS. 1a and 1b are schematic views showing a capacitance type touch sensor included in a touch input device according to an embodiment of the present invention and a configuration for operations of the same.

Specific embodiments of the present invention will be described in detail with reference to the accompanying drawings. The specific embodiments shown in the accompanying drawings will be described in enough detail that those skilled in the art are able to embody the present invention. Other embodiments other than the specific embodiments are mutually different, but do not have to be mutually exclusive. Additionally, it should be understood that the following detailed description is not intended to be limited.

The detailed descriptions of the specific embodiments shown in the accompanying drawings are intended to be read in connection with the accompanying drawings, which are to be considered part of the entire written description. Any reference to direction or orientation is merely intended for convenience of description and is not intended in any way to limit the scope of the present invention.

Specifically, relative terms such as "lower," "upper," "horizontal," "vertical," "above," "below," "up," "down,"

"top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation.

Terms such as "attached," "affixed," "connected," "coupled," "interconnected," and similar refer to a relationship wherein structures are attached, connected or fixed to one another either directly or indirectly through intervening structures, as well as both movable or rigid attachments or relationships, unless expressly described otherwise.

A touch input device according to the embodiment of the present invention can be used not only in a portable electronic product such as a smartphone, smartwatch, tablet PC, laptop computer, personal digital assistant (PDA), MP3 player, camera, camcorder, electronic dictionary, etc., but also in an electric home appliance such as a home PC, TV, DVD, refrigerator, air conditioner, microwave, etc. Also, the touch force detectable touch input device including a display module in accordance with the embodiment of the present invention can be used without limitation in all of the products requiring a device for display and input such as an industrial control device, a medical device, etc.

Hereafter, a touch input device capable of detecting a force in accordance with the embodiment of the present invention will be described with reference to the accompanying drawings. While a capacitance type touch sensor 10 is exemplified below, the touch sensor 10 capable of detecting a touch position in any manner may be applied.

FIG. 1a is schematic views of a configuration of the capacitance type touch sensor 10 included in the touch input device according to the embodiment of the present invention and the operation of the capacitance type touch sensor. Referring to FIG. 1a, the touch sensor 10 may include a plurality of drive electrodes TX1 to TXn and a plurality of receiving electrodes RX1 to RXm, and may include a drive unit 12 which applies a drive signal to the plurality of the drive electrodes TX1 to TXn for the purpose of the operation of the touch sensor 10, and a sensing unit 11 which detects the touch and the touch position by receiving from the plurality of the receiving electrodes RX1 to RXm a sensing signal including information on a capacitance change amount changing according to the touch on a touch surface.

As shown in FIG. 1a, the touch sensor 10 may include the plurality of drive electrodes TX1 to TXn and the plurality of receiving electrodes RX1 to RXm. While FIG. 1a shows that the plurality of drive electrodes TX1 to TXn and the plurality of receiving electrodes RX1 to RXm of the touch sensor 10 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

The plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

Figure 16A:
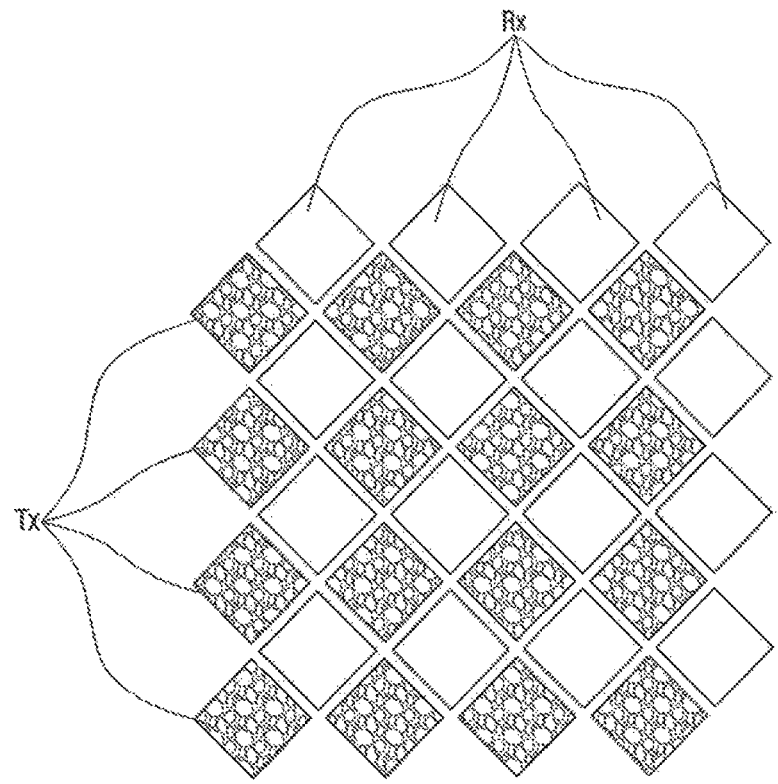
FIGS. 16a to 16d are views showing a form of an electrode included in the touch input device according to the embodiment of the present invention.
Figure 16B:
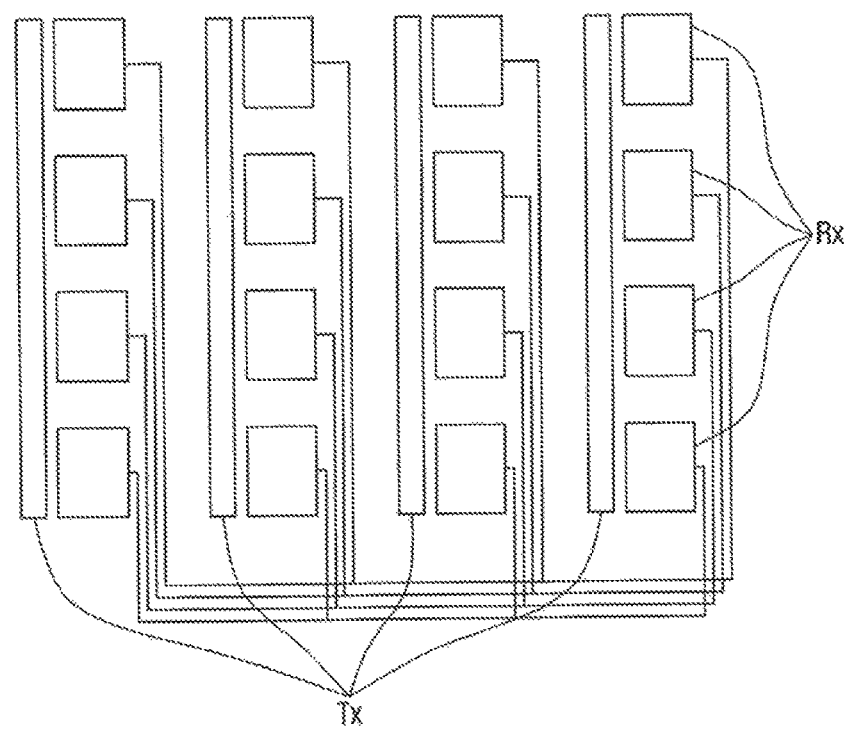

As shown in FIGS. 16a and 16b, in the touch sensor 10 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on a top surface of a display panel 200A to be described later.

Figure 16C:
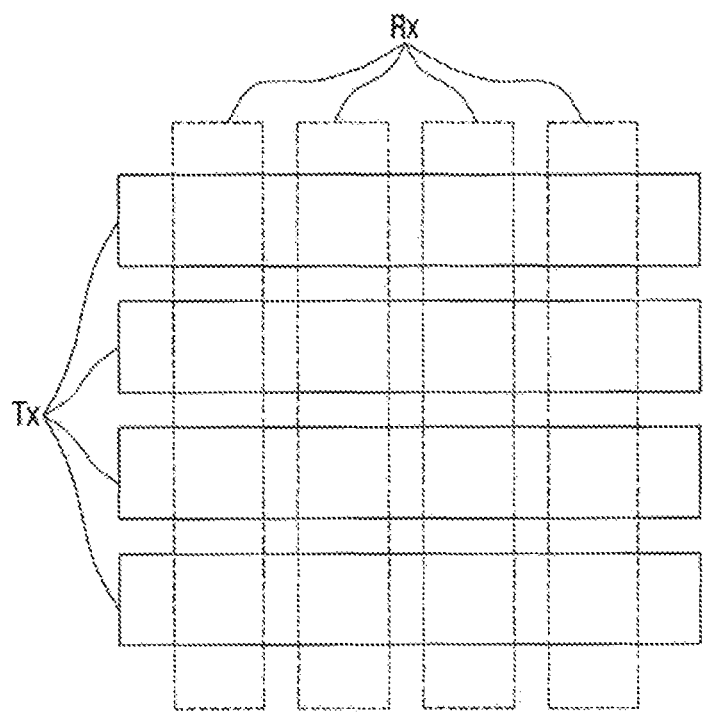

Also, as shown in FIG. 16c, the plurality of drive electrodes TX1 to TXn and the plurality of receiving electrodes RX1 to RXm may be formed in different layers. For example, any one of the plurality of drive electrodes TX1 to TXn and the plurality of receiving electrodes RX1 to RXm may be formed on the top surface of the display panel 200A, and the other may be formed on a bottom surface of a cover to be described later or may be formed within the display panel 200A.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide ($SnO_2$), and indium oxide ($In_2O_3$), etc.), or the like. However, this is only an example. The drive electrode TX and the receiving electrode RX may be also made of another transparent conductive material or an opaque conductive material. For instance, the drive electrode TX and the receiving electrode RX may include at least any one of silver ink, copper, and carbon nanotube (CNT). Also, the drive electrode TX and the receiving electrode RX may be made of metal mesh.

The drive unit 12 according to the embodiment of the present invention may apply a drive signal to the drive electrodes TX1 to TXn. In the embodiment of the present invention, one drive signal may be sequentially applied at a time to the first drive electrode TX1 to the n-th drive electrode TXn. The drive signal may be applied again repeatedly. This is only an example. The drive signal may be applied to the plurality of drive electrodes at the same time in accordance with the embodiment.

Through the receiving electrodes RX1 to RXm, the sensing unit 11 receives the sensing signal including information on a capacitance (Cm) 101 generated between the receiving electrodes RX1 to RXm and the drive electrodes TX1 to TXn to which the driving signal has been applied, thereby detecting whether or not the touch has occurred and where the touch has occurred. For example, the sensing signal may be a signal coupled by the capacitance (Cm) 101 generated between the receiving electrode RX and the drive electrode TX to which the driving signal has been applied. As such, the process of sensing the driving signal applied from the first drive electrode TX1 to the n-th drive electrode TXn through the receiving electrodes RX1 to RXm can be referred to as a process of scanning the touch sensor 10.

For example, the sensing unit 11 may include a receiver (not shown) which is connected to each of the receiving electrodes RX1 to RXm through a switch. The switch becomes the on-state in a time interval during which the signal of the corresponding receiving electrode RX is sensed, thereby allowing the receiver to sense the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground. Also, the receiver may further include a reset switch which is connected in parallel with the feedback capacitor. The reset switch may reset the conversion from current to voltage that is performed by the receiver. The negative input terminal of the amplifier is connected to the corresponding receiving electrode RX and receives and integrates a current signal including information on the capacitance (Cm) 101, and then converts the integrated current signal into voltage. The sensing unit 11 may further include an analog to digital converter (ADC) (not shown) which converts the integrated data by the receiver into digital data. Later, the digital data may be input to a processor (not shown) and processed to obtain information on the touch on the touch sensor 10. The sensing unit 11 may include the ADC and processor as well as the receiver.

A controller 13 may perform a function of controlling the operations of the drive unit 12 and the sensing unit 11. For example, the controller 13 generates and transmits a drive control signal to the drive unit 12, so that the driving signal can be applied to a predetermined drive electrode TX1 at a predetermined time. Also, the controller 13 generates and transmits the drive control signal to the sensing unit 11, so that the sensing unit 11 may receive the sensing signal from the predetermined receiving electrode RX at a predetermined time and perform a predetermined function.

In FIG. 1a, the drive unit 12 and the sensing unit 11 may constitute a touch detection device (not shown) capable of detecting whether the touch has occurred on the touch sensor 10 or not and where the touch has occurred. The touch detection device may further include the controller 13. In the touch input device including the touch sensor 10, the touch detection device may be integrated and implemented on a touch sensing integrated circuit (IC), i.e., a touch sensing circuit. The drive electrode TX and the receiving electrode RX included in the touch sensor 10 may be connected to the drive unit 12 and the sensing unit 11 included in the touch sensing IC through, for example, a conductive trace and/or a conductive pattern printed on a circuit board, or the like. The touch sensing IC may be placed on a circuit board on which the conductive pattern has been printed, for example, a first printed circuit board (hereafter, referred to as a first PCB). According to the embodiment, the touch sensing IC may be mounted on a main board for operation of the touch input device.

As described above, a capacitance (Cm) with a predetermined value is generated at each crossing of the drive electrode TX and the receiving electrode RX. When an object like a finger approaches close to the touch sensor 10, the value of the capacitance may be changed. In FIG. 1a, the capacitance may represent a mutual capacitance (Cm). The sensing unit 11 senses such electrical characteristics, thereby being able to sense whether the touch has occurred on the touch sensor 10 or not and where the touch has occurred. For example, the sensing unit 11 is able to sense whether the touch has occurred on the surface of the touch sensor 10 comprised of a two-dimensional plane consisting of a first axis and a second axis.

More specifically, when the touch occurs on the touch sensor 10, the drive electrode TX to which the driving signal has been applied is detected, so that the position of the second axial direction of the touch can be detected. Likewise, when the touch occurs on the touch sensor 10, the capacitance change is detected from the reception signal received through the receiving electrode RX, so that the position of the first axial direction of the touch can be detected.

Up to now, although the operation mode of the touch sensor 10 sensing the touch position has been described on the basis of the mutual capacitance change amount between the drive electrode TX and the receiving electrode RX, the embodiment of the present invention is not limited to this. That is, as shown in FIG. 1b, it is also possible to detect the touch position on the basis of the change amount of a self-capacitance.

Figure 1B:
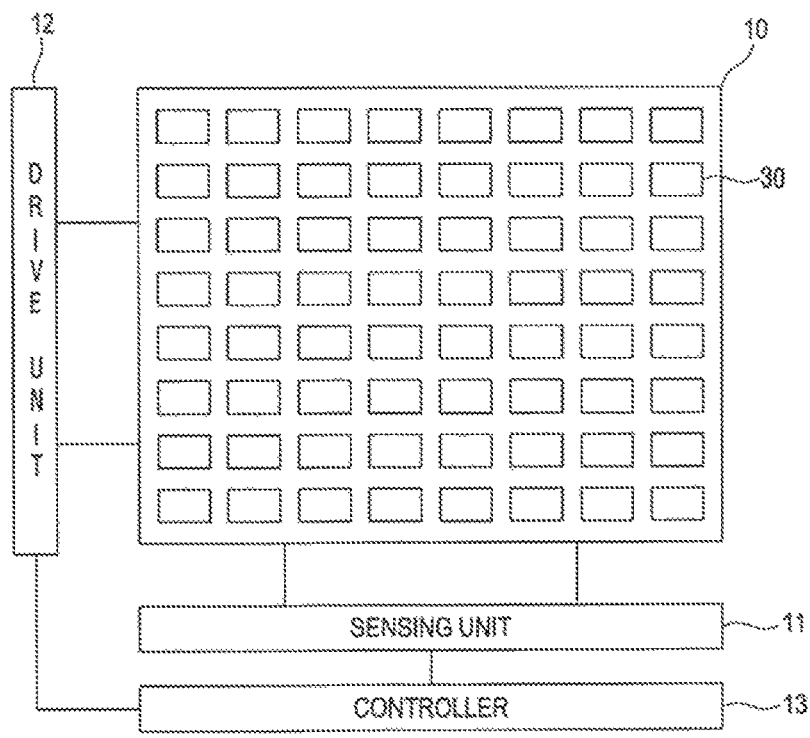
Figure 16D:
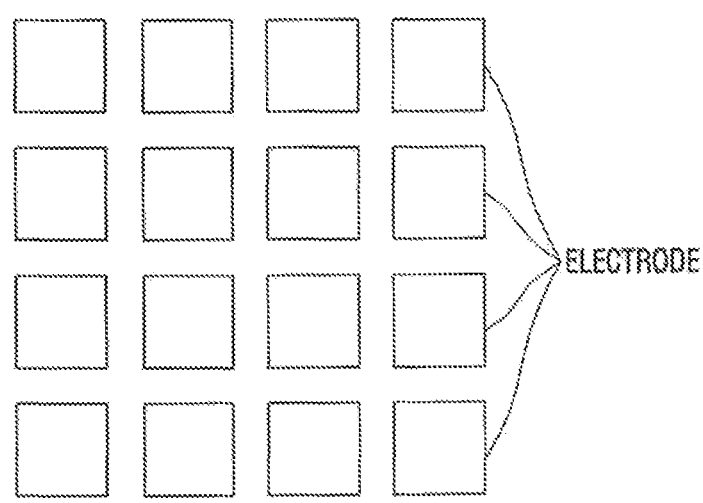

FIG. 1b is schematic views of a configuration of another capacitance type touch sensor 10 included in the touch input device according to another embodiment of the present invention and the operation of the capacitance type touch sensor. A plurality of touch electrodes 30 are provided on the touch sensor 10 shown in FIG. 1b. Although the plurality of touch electrodes 30 may be, as shown in FIG. 16d, disposed at a regular interval in the form of a grid, the present invention is not limited to this.

The drive control signal generated by the controller 130 is transmitted to the drive unit 12. On the basis of the drive control signal, the drive unit 12 applies the drive signal to the predetermined touch electrode 30 for a predetermined time period. Also, the drive control signal generated by the controller 13 is transmitted to the sensing unit 11. On the basis of the drive control signal, the sensing unit 11 receives the sensing signal from the predetermined touch electrode 30 for a predetermined time period. Here, the sensing signal may be a signal for the change amount of the self-capacitance formed on the touch electrode 30.

Here, whether the touch has occurred on the touch sensor 10 or not and/or the touch position are detected by the sensing signal detected by the sensing unit 11. For example, since the coordinate of the touch electrode 30 has been known in advance, whether the touch of the object on the surface of the touch sensor 10 has occurred or not and/or the touch position can be detected.

In the foregoing, for convenience of description, it has been described that the drive unit 12 and the sensing unit 11 operate individually as a separate block. However, the operation to apply the drive signal to the touch electrode 30 and to receive the sensing signal from the touch electrode 30 can be also performed by one drive and sensing unit.

The foregoing has described in detail the capacitance type touch sensor as the touch sensor 10. However, in the touch input device 1000 according to the embodiment of the present invention, the touch sensor 10 for detecting whether or not the touch has occurred and the touch position may be implemented by using not only the above-described method but also any touch sensing method such as a surface capacitance type method, a projected capacitance type method, a resistance film method, a surface acoustic wave (SAW) method, an infrared method, an optical imaging method, a dispersive signal technology, and an acoustic pulse recognition method, etc.

Figure 2:
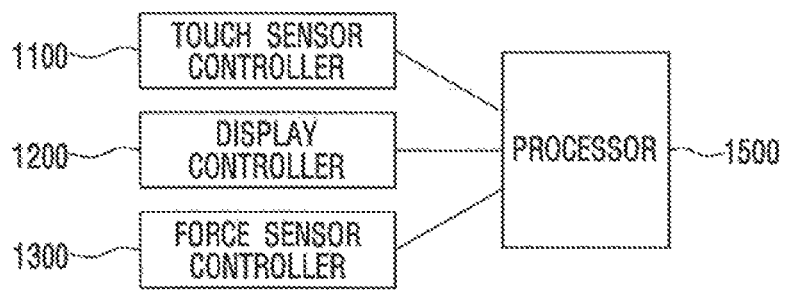
FIG. 2 shows a control block for controlling a touch position, a touch force, and a display operation in the touch input device according to the embodiment of the present invention.

FIG. 2 shows a control block for controlling the touch position, a touch force and a display operation in the touch input device according to the embodiment of the present invention. In the touch input device 1000 configured to detect the touch force in addition to the display function and touch position detection, the control block may include the above-described touch sensor controller 1100 for detecting the touch position, a display controller 1200 for driving the display panel, and a force sensor controller 1300 for detecting the force. The display controller 1200 may include a control circuit which receives an input from an application processor (AP) or a central processing unit (CPU) on a main board for the operation of the touch input device 1000 and displays the contents that the user wants on the display panel 200A. The control circuit may include a display panel control IC, a graphic controller IC, and a circuit required to operate other display panel 200A.

The force sensor controller 1300 for detecting the force through a force sensor may be configured similarly to the touch sensor controller 1100, and thus, may operate similarly to the touch sensor controller 1100.

According to the embodiment, the touch sensor controller 1100, the display controller 1200, and the force sensor controller 1300 may be included as different components in the touch input device 1000. For example, the touch sensor controller 1100, the display controller 1200, and the force sensor controller 1300 may be composed of different chips respectively. Here, a processor 1500 of the touch input device 1000 may function as a host processor for the touch sensor controller 1100, the display controller 1200, and the force sensor controller 1300.

The touch input device 1000 according to the embodiment of the present invention may include an electronic device including a display screen and/or a touch screen, such as a cell phone, a personal data assistant (PDA), a smartphone, a tablet personal computer (PC).

In order to manufacture such a thin and lightweight light-weighing touch input device 1000, the touch sensor controller 1100, the display controller 1200, and the force sensor controller 1300, which are, as described above, formed separately from each other, may be integrated into one or more configurations in accordance with the embodiment of the present invention. In addition to this, these controllers can be integrated into the processor 1500 respectively. Also, according to the embodiment of the present invention, the touch sensor 10 and/or the force sensor may be integrated into the display panel 200A.

In the touch input device 1000 according to the embodiment of the present invention, the touch sensor 10 for detecting the touch position may be positioned outside or inside the display panel 200A. The display panel 200A of the touch input device 1000 according to the embodiment of the present invention may be a display panel included in a liquid crystal display (LCD), a plasma display panel (PDP), an organic light emitting diode (OLED), etc. Accordingly, a user may perform the input operation by touching the touch surface while visually identifying an image displayed on the display panel.

Figure 3A:
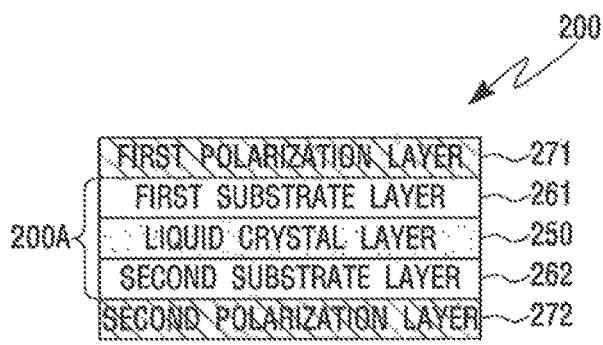
FIGS. 3a and 3b are conceptual views for describing a configuration of a display module in the touch input device according to the embodiment of the present invention.
Figure 3B:
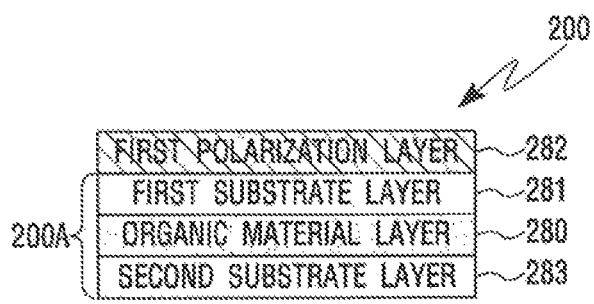

FIGS. 3a and 3b are conceptual views for describing a configuration of a display module 200 in the touch input device 1000 according to the embodiment of the present invention. First, the configuration of the display module 200 including the display panel 200A using an LCD panel will be described with reference to FIG. 3a.

As shown in FIG. 3a, the display module 200 may include the display panel 200A that is an LCD panel, a first polarization layer 271 disposed on the display panel 200A, and a second polarization layer 272 disposed under the display panel 200A. The display panel 200A that is an LCD panel may include a liquid crystal layer 250 including a liquid crystal cell, a first substrate layer 261 disposed on the liquid crystal layer 250, and a second substrate layer 262 disposed under the liquid crystal layer 250. Here, the first substrate layer 261 may be made of color filter glass, and the second substrate layer 262 may be made of TFT glass. Also, according to the embodiment, at least one of the first substrate layer 261 and the second substrate layer 262 may be made of a bendable material such as plastic. In FIG. 3a, the second substrate layer 262 may be comprised of various layers including a data line, a gate line, TFT, a common electrode, and a pixel electrode, etc. These electrical components may operate in such a manner as to generate a controlled electric field and orient liquid crystals located in the liquid crystal layer 250.

Next, the configuration of the display module 200 including the display panel 200A using an OLED panel will be described with reference to FIG. 3b.

As shown in FIG. 3b, the display module 200 may include the display panel 200A that is an OLED panel, and a first polarization layer 282 disposed on the display panel 200A. The display panel 200A that is an OLED panel may include an organic material layer 280 including an organic light-emitting diode (OLED), a first substrate layer 281 disposed on the organic material layer 280, and a second substrate layer 283 disposed under the organic material layer 280. Here, the first substrate layer 281 may be made of encapsulation glass, and the second substrate layer 283 may be made of TFT glass. Also, according to the embodiment, at least one of the first substrate layer 281 and the second substrate layer 283 may be made of a bendable material such as plastic. The OLED panel shown in FIG. 3b may include an electrode used to drive the display panel 200A, such as a gate line, a data line, a first power line (ELVDD), a second power line (ELVSS), etc. The organic light-emitting diode (OLED) panel is a self-light emitting display panel which uses a principle where, when current flows through a fluorescent or phosphorescent organic thin film and then electrons and electron holes are combined in the organic material layer, so that light is generated. The organic material constituting the light emitting layer determines the color of the light.

Specifically, the OLED uses a principle in which when electricity flows and an organic matter is applied on glass or plastic, the organic matter emits light. That is, the principle is that electron holes and electrons are injected into the anode and cathode of the organic matter respectively and are recombined in the light emitting layer, so that a high energy exciton is generated and the exciton releases the energy while falling down to a low energy state and then light with a particular wavelength is generated. Here, the color of the light is changed according to the organic matter of the light emitting layer.

The OLED includes a line-driven passive-matrix organic light-emitting diode (PM-OLED) and an individual driven active-matrix organic light-emitting diode (AM-OLED) in accordance with the operating characteristics of a pixel constituting a pixel matrix. None of them require a backlight. Therefore, the OLED enables a very thin display module to be implemented, has a constant contrast ratio according to an angle and obtains a good color reproductivity depending on a temperature. Also, it is very economical in that non-driven pixel does not consume power.

In terms of operation, the PM-OLED emits light only during a scanning time at a high current, and the AM-OLED maintains a light emitting state only during a frame time at a low current. Therefore, the AM-OLED has a resolution higher than that of the PM-OLED and is advantageous for driving a large area display panel and consumes low power. Also, a thin film transistor (TFT) is embedded in the AM-OLED, and thus, each component can be individually controlled, so that it is easy to implement a delicate screen.

Also, the organic material layer 280 may include a hole injection layer (HIL), a hole transport layer (HTL), an electron injection layer (EIL), an electron transport layer (ETL), and an light-emitting layer (EML).

Briefly describing each of the layers, HIL injects electron holes and is made of a material such as CuPc, etc. HTL functions to move the injected electron holes and mainly is made of a material having a good hole mobility. The HTL may be made of Arylamine, TPD, and the like. The EIL and ETL inject and transport electrons. The injected electrons and electron holes are combined in the EML and emit light. The EML represents the color of the emitted light and is composed of a host determining the lifespan of the organic matter and an impurity (dopant) determining the color sense and efficiency. This just describes the basic structure of the organic material layer 280 include in the OLED panel. The present invention is not limited to the layer structure or material, etc., of the organic material layer 280.

The organic material layer 280 is inserted between an anode (not shown) and a cathode (not shown). When the TFT becomes an on-state, a driving current is applied to the anode and the electron holes are injected, and the electrons are injected to the cathode. Then, the electron holes and electrons move to the organic material layer 280 and emit the light.

It will be apparent to a skilled person in the art that the LCD panel or the OLED panel may further include other structures so as to perform the display function and may be modified.

The display module 200 of the touch input device 1000 according to the embodiment of the present invention may include the display panel 200A and a configuration for driving the display panel 200A. Specifically, when the display panel 200A is an LCD panel, the display module 200 may include a backlight unit (not shown) disposed under the second polarization layer 272 and may further include a display panel control IC for operation of the LCD panel, a graphic control IC, and other circuits.

In the touch input device 1000 according to the embodiment of the present invention, the touch sensor 10 for detecting the touch position may be positioned outside or inside the display module 200.

When the touch sensor 10 in the touch input device 1000 positioned outside the display module 200, the touch sensor panel may be disposed on the display module 200, and the touch sensor 10 may be included in the touch sensor panel. The touch surface of the touch input device 1000 may be the surface of the touch sensor panel.

When the touch sensor 10 in the touch input device 1000 positioned inside the display module 200, the touch sensor 10 may be configured to be positioned outside the display panel 200A. Specifically, the touch sensor 10 may be formed on the top surfaces of the first substrate layers 261 and 281. Here, the touch surface of the touch input device 1000 may be an outer surface of the display module 200 and may be the top surface or bottom surface in FIGS. 3 and 3b.

When the touch sensor 10 in the touch input device 1000 positioned inside the display module 200, at least a portion of the touch sensor 10 may be configured to be positioned inside the display panel 200A, and at least a portion of the remaining touch sensor 10 may be configured to be positioned outside the display panel 200A. For example, any one of the drive electrode TX and the receiving electrode RX, which constitute the touch sensor 10, may be configured to be positioned outside the display panel 200A, and the other may be configured to be positioned inside the display panel 200A. Specifically, any one of the drive electrode TX and the receiving electrode RX, which constitute the touch sensor 10, may be formed on the top surface of the top surfaces of the first substrate layers 261 and 281, and the other may be formed on the bottom surfaces of the first substrate layers 261 and 281 or may be formed on the top surfaces of the second substrate layers 262 and 283.

When the touch sensor 10 in the touch input device 1000 positioned inside the display module 200, the touch sensor 10 may be configured to be positioned inside the display panel 200A. Specifically, the touch sensor 10 may be formed on the bottom surfaces of the first substrate layers 261 and 281 or may be formed on the top surfaces of the second substrate layers 262 and 283.

When the touch sensor 10 is positioned inside the display panel 200A, an electrode for operation of the touch sensor may be additionally disposed. However, various configurations and/or electrodes positioned inside the display panel 200A may be used as the touch sensor 10 for sensing the touch. Specifically, when the display panel 200A is the LCD panel, at least any one of the electrodes included in the touch sensor 10 may include at least any one of a data line, a gate line, TFT, a common electrode (Vcom), and a pixel electrode. When the display panel 200A is the OLED panel, at least any one of the electrodes included in the touch sensor 10 may include at least any one of a data line, a gate line, a first power line (ELVDD), and a second power line (ELVSS).

Here, the touch sensor 10 may function as the drive electrode and the receiving electrode described in FIG. 1a and the touch position in accordance with the mutual capacitance between the drive electrode and the receiving electrode may be detected. Also, the touch sensor 10 may function as the single electrode 30 described in FIG. 1b and the touch position in accordance with the self-capacitance of each of the single electrodes 30 may be detected. Here, if the electrode included in the touch sensor 10 is used to drive the display panel 200A, the display panel 200A may be driven in a first time interval and the touch position may be detected in a second time interval different from the first time interval.

Figure 4A:
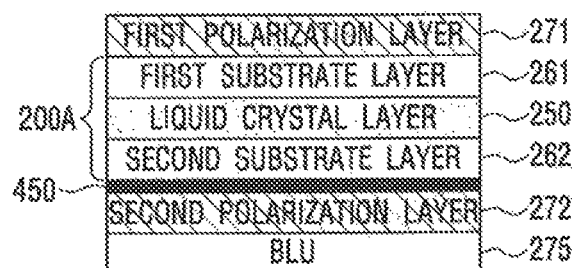
FIGS. 4a to 4b are cross sectional views showing an embodiment of a strain gauge directly formed on various display panels on the touch input device according to the embodiment of the present invention.
Figure 4B:
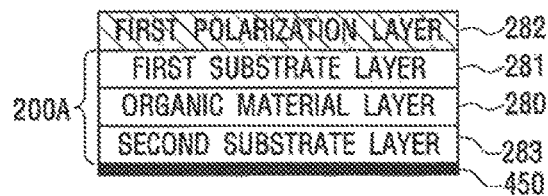

In the touch input device 1000 according to the embodiment of the present invention, a strain gauge 450 may be directly formed on the display panel 200A. FIGS. 4a to 4b are cross sectional views showing an embodiment of the strain gauge directly formed on various display panels on the touch input device according to the embodiment of the present invention.

First, FIG. 4a shows the strain gauge 450 formed on the display panel 200A using the LCD panel. Specifically, as shown in FIG. 4a, the strain gauge 450 may be formed on the bottom surface of the second substrate 262. Here, the strain gauge 450 may be formed on the bottom surface of the second polarization layer 272. Next, FIG. 4b shows the strain gauge 450 formed on the bottom surface of the display panel 200A using the OLED panel (particularly, AM-OLED panel). Specifically, the strain gauge 450 may be formed on the bottom surface of the second substrate layer 283.

In the OLED panel, since the organic material layer 280 emits light, the strain gauge 450 which is formed on the bottom surface of the second substrate layer 283 disposed under the organic material layer 280 may be made of an opaque material. However, in this case, a pattern of the strain gauge 450 formed on the bottom surface of the display panel 200A may be shown to the user. Therefore, for the purpose of preventing the above problem, the display panel 200A may further include a light shielding layer. Specifically, the light shielding layer may be disposed under the second substrate layer 283 on which the strain gauge 450 has been formed. Also, the light shielding layer like black ink is applied on the bottom surface of the second substrate layer 283, and then the strain gauge 450 may be formed on the light shielding layer. That is, the light shielding layer may be disposed on the bottom surface of the second substrate layer 283, and the strain gauge 450 may be formed on the bottom surface of the light shielding layer.

Also, FIG. 4b shows that the strain gauge 450 is formed on the bottom surface of the second substrate layer 283.

However, the display panel 200A may further include a third substrate layer (not shown). Specifically, the third substrate layer may be disposed under the second substrate layer 283, and the strain gauge 450 may be formed on the bottom surface of the third substrate layer. In particular, when the display panel 200A is a flexible OLED panel, the third substrate layer which is relatively less bent may be disposed under the second substrate layer 283 because the display panel 200A composed of the first substrate layer 281, the organic material layer 280, and the second substrate layer 283 is very thin and easily bent.

Here, the display panel 200A may further include the light shielding layer for preventing the pattern of the strain gauge 450 from being visible to the user. Specifically, the light shielding layer may be disposed under the third substrate layer on which the strain gauge 450 has been formed. Also, after the light shielding layer is disposed under the third substrate layer, the strain gauge 450 may be formed on the light shielding layer. In other words, the light shielding layer may be disposed on the bottom surface of the third substrate layer, and the strain gauge 450 may be formed on the bottom surface of the light shielding layer. Also, the light shielding layer may be disposed between the second substrate layer 283 and the third substrate layer.

Further, for example, a substrate having a function of shielding the light such as a black-colored substrate may be used as the third substrate layer. As such, when the third substrate has the light shielding function, the pattern of the strain gauge 450 formed under the display panel 200A may not be visible to the user even without disposing a separate light shielding layer.

FIGS. 5a to 5d show an example in which the strain gauge is applied to the touch input device according to the embodiment of the present invention.

In the touch input device 1000 according to the embodiment of the present invention, by means of an adhesive like an optically clear adhesive (OCA), lamination may occur between a cover layer 100 on which the touch sensor for detecting the touch position has been formed and the display module 200 including the display panel 200A. As a result, the display color clarity, visibility and optical transmittance of the display module 200, which can be recognized through the touch surface of the touch sensor, can be improved.

Figure 5A:
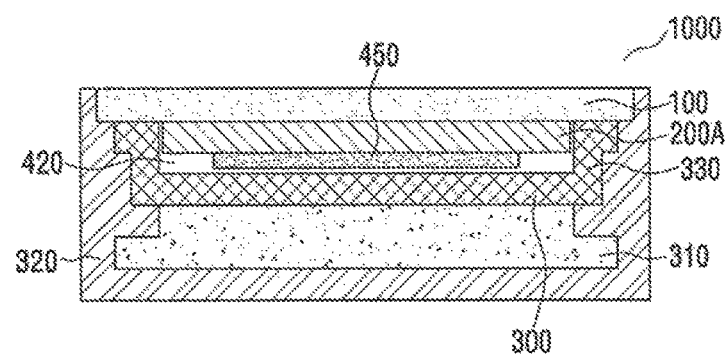
FIGS. 5a to 5d show an example in which the strain gauge is applied to the touch input device according to the embodiment of the present invention.

In FIG. 5a and some of the following figures, it is shown that the display panel 200A is directly laminated on and attached to the cover layer 100. However, this is only for convenience of description. The display module 200 where the first polarization layers 271 and 282 is located on the display panel 200A may be laminated on and attached to the cover layer 100. When the LCD panel is the display panel 200A, the second polarization layer 272 and the backlight unit are omitted.

Figure 5B:
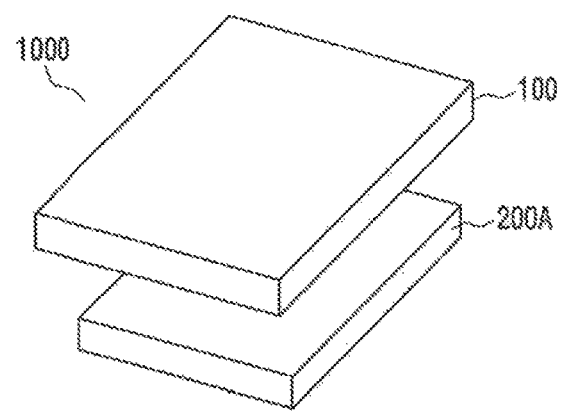
Figure 5B:
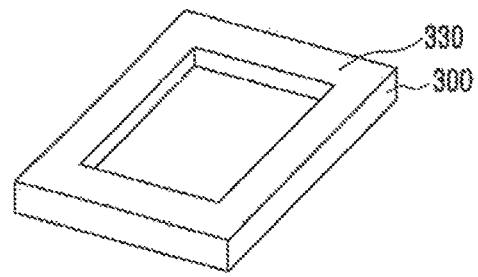

In the description with reference to FIGS. 5a to 5d, it is shown that as the touch input device 1000 according to the embodiment of the present invention, the cover layer 100 in which the touch sensor has been formed is laminated on and attached to the display module 200 shown in FIGS. 3a and 3b by means of an adhesive. However, the touch input device 1000 according to the embodiment of the present invention may include that the touch sensor 10 is disposed inside the display module 200 shown in FIGS. 3a and 3b. More specifically, while FIGS. 5a and 5b show that the cover layer 100 where the touch sensor has been formed covers the display module 200 including the display panel 200A, the touch input device 1000 which includes the touch sensor 10 disposed inside the display module 200 and includes the display module 200 covered with the cover layer 100 like glass may be used as the embodiment of the present invention.

The touch input device 1000 according to the embodiment of the present invention may include an electronic device including the touch screen, for example, a cell phone, a personal data assistant (PDA), a smart phone, a tablet personal computer, an MP3 player, a laptop computer, etc.

In the touch input device 1000 according to the embodiment of the present invention, a substrate 300, together with an outermost housing 320 of the touch input device 1000, may function to surround a mounting space 310, etc., where the circuit board and/or battery for operation of the touch input device 1000 are placed. Here, the circuit board for operation of the touch input device 1000 may be a main board. A central processing unit (CPU), an application processor (AP) or the like may be mounted on the circuit board. Due to the substrate 300, the display module 200 is separated from the circuit board and/or battery for operation of the touch input device 1000. Due to the substrate 300, electrical noise generated from the display module 200 and noise generated from the circuit board can be blocked.

The touch sensor 10 or the cover layer 100 of the touch input device 1000 may be formed wider than the display module 200, the substrate 300, and the mounting space 310. As a result, the housing 320 may be formed such that the housing 320, together with the touch sensor 10, surrounds the display module 200, the substrate 300, and the circuit board.

Hereafter, for the purpose of clearly distinguishing between the force sensor 450 and the electrode included in the touch sensor 10, the force sensor 450 for detecting the force is referred to as the strain gauge 450.

The touch input device 1000 according to the embodiment of the present invention may detect the touch position through the touch sensor 10, and the touch force can be detected by the strain gauge 450 formed on the display module 200. Here, the touch sensor 10 may be disposed inside or outside the display module 200.

The touch input device 1000 according to the embodiment of the present invention may be formed to further include a spacer layer 420 composed of an air gap. Here, according to the embodiment, the spacer layer 420 may be made of an impact absorbing material. According to the embodiment, the spacer layer 420 may be filled with a dielectric material.

Here, since the strain gauge 450 is disposed in the rear side instead of in the front side of the display panel 200A, the strain gauge 450 may be made of an opaque material as well as a transparent material. When the display panel 200A is the LCD panel, the light from the backlight unit must transmit through the strain gauge 450. Therefore, the strain gauge 450 may be made of a transparent material such as ITO.

Here, a frame 330 having a predetermined height may be formed along the border of the upper portion of the substrate 300 in order to maintain the spacer layer 420. Here, the frame 330 may be bonded to the cover layer 100 by means of an adhesive tape (not shown). While FIG. 5b shows the frame 330 is formed on the entire border (e.g., four sides of the quadrangle) of the substrate 300, the frame 330 may be formed only on at least some (e.g., three sides of the quadrangle) of the border of the substrate 300. According to the embodiment, the frame 330 may be formed on the top surface of the substrate 300 may be integrally formed with the substrate 300 on the top surface of the substrate 300. In the embodiment of the present invention, the frame 330 may be made of an inelastic material. In the embodiment of the present invention, when a force is applied to the display panel 200A through the cover layer 100, the display panel 200A, together with the cover layer 100, may be bent. Therefore, the magnitude of the touch force can be detected even though the frame 330 is not deformed by the force.

Figure 5C:
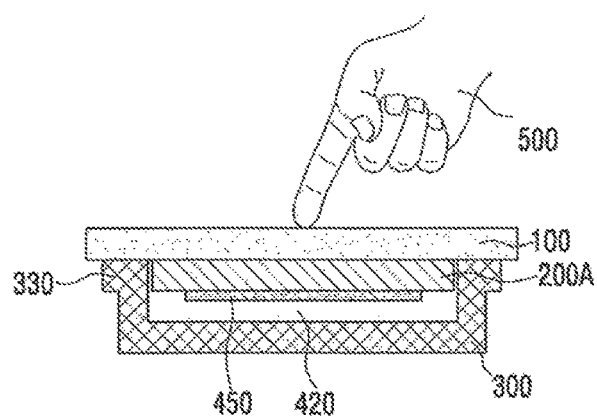

FIG. 5c is a cross sectional view of the touch input device including the strain gauge according to the embodiment of the present invention. As shown in FIG. 5c, the strain gauge 450 according to the embodiment of the present invention may be formed on the bottom surface of the display panel 200A.

Figure 5D:
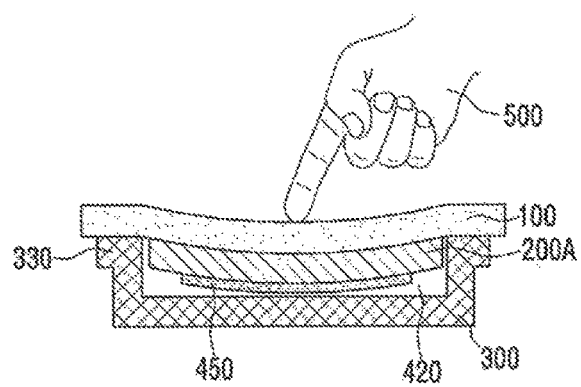

FIG. 5d is a cross sectional view when a force is applied to the touch input device 1000 shown in FIG. 5c. The top surface of the substrate 300 may have a ground potential so as to block the noise. When a force is applied to the surface of the cover layer 100 by an object 500, the cover layer 100 and the display panel 200A may be bent or pressed. Due to the bending of the display panel 200A, the strain gauge 450 formed on the display panel 200A is deformed. Accordingly, the resistance value of the strain gauge 450 may be changed. The magnitude of the touch force can be calculated by the change of the resistance value.

In the touch input device 1000 according to the embodiment of the present invention, the display panel 200A may be bent or pressed by the touch applying the force. The display panel 200A may be bent or pressed to show deformation by the touch. When the display panel 200A is bent or pressed according to the embodiment, a position showing the biggest deformation may not match the touch position. However, the display panel 200A may be shown to be bent at least at the touch position. For example, when the touch position approaches close to the border, edge, etc., of the display panel 200A, the most bent or pressed position of the display panel 200A may not match the touch position, however, the display panel 200A may be shown to be bent or pressed at least at the touch position.

FIGS. 6a and 6d to 6f are plan views showing an exemplary force sensor capable of sensing a force used in the touch input device according to the embodiment of the present invention. In this case, the force sensor may be the strain gauge. The electrical resistance of the strain gauge is changed in proportional to the amount of strain. Typically, a metal-bonded strain gauge may be used.

A transparent material used for the strain gauge may include conductive polymer (polyethylenedioxythiophene (PEDOT)), indium tin oxide (ITO), Antimony tin oxide (ATO), carbon nanotubes (CNT), graphene, gallium zinc oxide, indium gallium zinc oxide (IGZO), $SnO_2$, $In_2O_3$, ZnO, $Ga_2O_3$, CdO, other doped metal oxides, piezoresistive element, piezoresistive semiconductor materials, piezoresistive metal material, silver nanowire, platinum nanowire, nickel nanowire, other metallic nanowires, etc. An opaque material used for the strain gauge may include silver ink, copper, nano silver, carbon nanotube (CNT), Constantan alloy, Karma alloys, doped polycrystalline silicon, doped amorphous silicon, doped single crystal silicon, other doped semiconductor materials, etc.

Figure 6A:
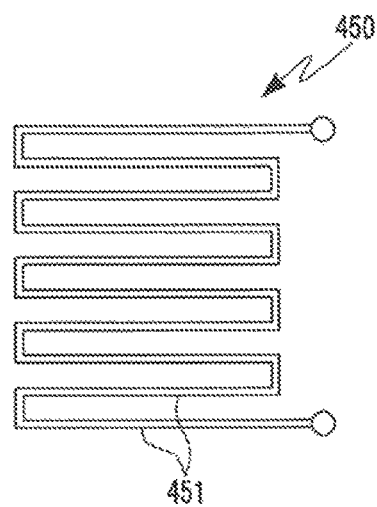
FIGS. 6a and 6d to 6f are plan views showing an exemplary force sensor capable of sensing a force used in the touch input device according to the embodiment of the present invention.

As shown in FIG. 6a, the metal strain gauge may be composed of metal foils arranged in a grid-like manner. Through the grid-like manner, it is possible to maximize the deformation amount of a metal wire or foil which tends to be deformed in a parallel direction. Here, the vertical grid cross section of the strain gauge 450 shown in FIG. 6a may be minimized in order to reduce the effects of shear strain and Poisson strain.

In FIG. 6a, while the strain gauge 450 is at rest, that is to say, is not strained or deformed, the strain gauge 450 may include traces 451 which are disposed close to each other without contacting each other. The strain gauge may have a normal resistance such as 1.8KΩ±0.1% when strain or force is not applied. A sensitivity for the strain may be represented as a basic parameter of the strain gauge by a gauge factor (GF). Here, the gauge factor may be defined as a ratio of the change of the electrical resistance to the change of the length (strain) and may be represented as follows by a function of a strain ε.

$$GF = \frac{\Delta R/R}{\Delta L/L} = \frac{\Delta R/R}{\varepsilon}$$

Here, ΔR represents the change amount of the strain gauge resistance, R represents a resistance of an undeformed strain gauge, and GF represents the gauge factor.

Figure 6B:
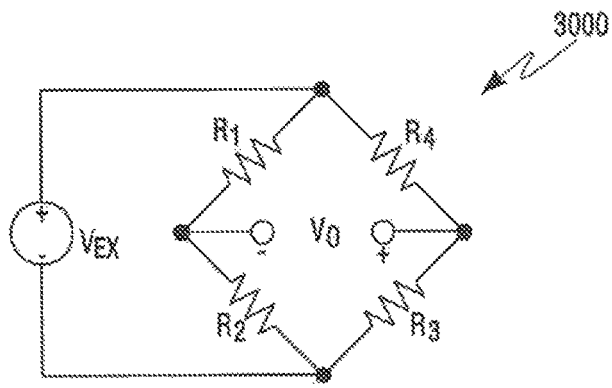
FIGS. 6b and 6c show an exemplary strain gauge which can be applied to the touch input device according to the embodiment of the present invention.
Figure 6C:
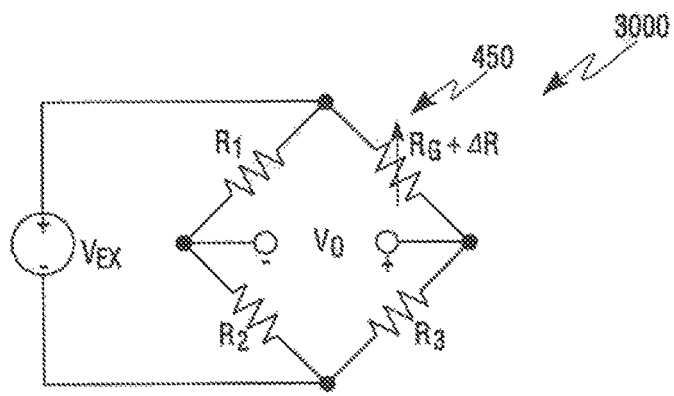

Here, in most cases, in order to measure the small change of the resistance, the strain gauge is used to establish a bridge including a voltage drive source. FIGS. 6b and 6c show an exemplary strain gauge which can be applied to the touch input device according to the embodiment of the present invention. As shown in the example of FIG. 6b, the strain gauge is included in a Wheatstone bridge 3000 having four different resistances (represented as R1, R2, R3, and R4) and may detect the resistance change of the gauge (to other resistors), which represents the applied force. The bridge 3000 is coupled to a force sensor interface (not shown) and receives the drive signal (voltage $V_{EX}$) from a touch controller (not shown) and then drives the strain gauge, and, for the signal process, transmits sensing signal (voltage Vo) representing the applied force to the touch controller. Here, the output voltage (Vo) of the bridge 3000 may be represented as follows.

$$V_O = \left[\frac{R_3}{R_3 + R_4} - \frac{R_2}{R_1 + R_2}\right] \cdot V_{EX}$$

In the above equation, when R1/R2=R4/R3, the output voltage Vo becomes 0. Under this condition, the bridge 3000 is in a balanced state. Here, the value of any one of the resistances included in the bridge 3000 is changed, a non-zero output voltage Vo is output.

Here, as shown in FIG. 6c, when the strain gauge 450 is $R_G$ and the $R_G$ is changed, the resistance change of the strain gauge 450 causes imbalance of the bridge and generates the non-zero output voltage Vo. The normal resistance of the strain gauge 450 is $R_G$, the resistance change, i.e., ΔR that is induced by the deformation may be represented by ΔR=$R_G$×GF×ε through the gauge factor equation. Here, when it is assumed that R1=R2 and R3=$R_G$, the bridge equation may be represented again by a function of the strain ε of $V_O/V_{EX}$ as follows.

$$\frac{V_O}{V_{EX}} = -\frac{GF \cdot \varepsilon}{4}\left(\frac{1}{1 + GF \cdot \frac{\varepsilon}{2}}\right)$$

Though the bridge of FIG. 6c includes only one strain gauge 450, even four strain gauges can be used at positions indicated by R1, R2, R3, and R4 included in the bridge of FIG. 6b. In this case, it can be understood that the resistance changes of the gauges can be used to detect the applied force.

As shown in FIGS. 5c and 5d, when a force is applied to the display panel 200A on which the strain gauge 450 has been formed, the display panel 200A is bent. Due to the bending of the display panel 200A, the trace 451 is extended and becomes longer and narrower, so that the resistance of the strain gauge 450 increases. As the applied force increases, the resistance of the strain gauge 450 may increase in response to the increase of the force. Therefore, when the force sensor controller 1300 detects the increase of the resistance value of the strain gauge 450, the increase may be interpreted as the force applied to the display panel 200A.

In another embodiment, the bridge 3000 may be integrated with the force sensor controller 1300. In this case, at least one of the resistances R1, R2, and R3 may be replaced with the resistance within the force sensor controller 1300. For example, the resistances R1 and R2 may be replaced with the resistances within the force sensor controller 1300 and the bridge 3000 may be composed of the strain gauge 450 and the resistance R1. As a result, a space occupied by the bridge 3000 can be reduced.

Figure 6D:
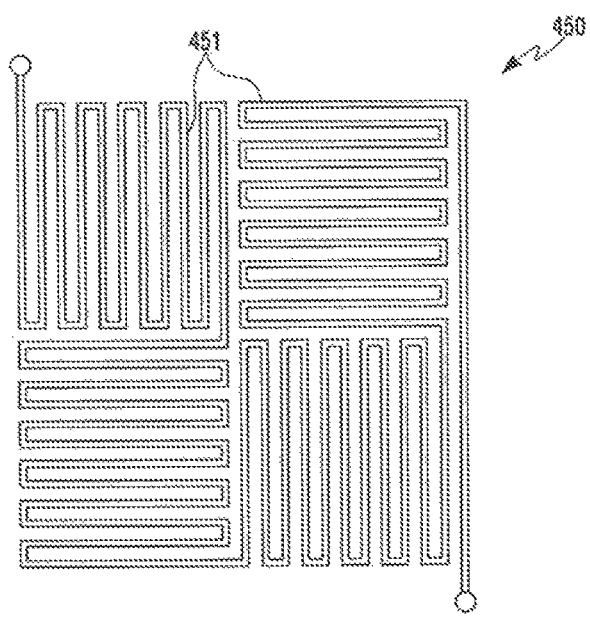

In the strain gauge 450 shown in FIG. 6a, the traces 451 are arranged in a horizontal direction. Therefore, the sensitivity for the horizontal deformation is high because the length change of the trace 451 is large with respect to the horizontal deformation. However, the sensitivity for the vertical deformation is low because the length change of the trace 451 is relatively small with respect to the vertical deformation. As shown in FIG. 6d, the strain gauge 450 may include a plurality of sub-areas, and the arrangement direction of the traces 451 included in the respective sub-areas may be different. As such, the strain gauge 450 including the traces 451 of which the arrangement directions are different is provided, so that the sensitivity difference of the strain gauge 450 with respect to the deformation direction can be reduced.

Figure 6E:
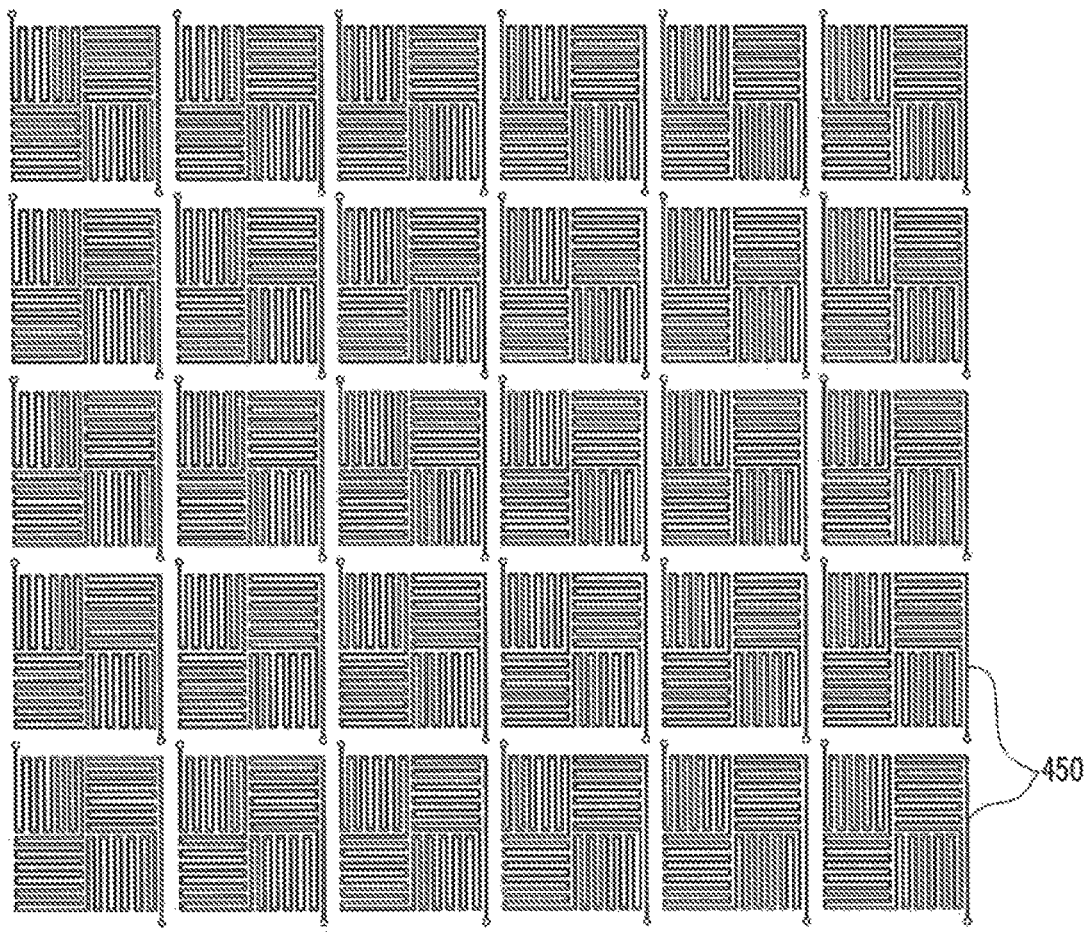

In the touch input device 1000 according to the embodiment of the present invention, one strain gauge 450 is, as shown in FIGS. 6a and 6d, formed under the display panel 200A, so that the force sensor composed of a single channel can be provided. Also, in the touch input device 1000 according to the embodiment of the present invention, a plurality of the strain gauges 450 are, as shown in FIG. 6e, formed under the display panel 200A, so that the force sensor composed of a plurality of the channels can be provided. By using such a force sensor composed of the plurality of the channels, the magnitude of each of the plurality of the forces on the plurality of the touches can be simultaneously sensed.

Temperature rise expands the display panel 200A even without the force applied, and thus, the strain gauge 450 formed on the display panel 200A may be extended. Therefore, the temperature change may have a bad influence on the strain gauge 450. As a result, the resistance of the strain gauge 450 may be increased, which may be incorrectly interpreted that a force is applied to the strain gauge 450.

For the purpose of compensating for the temperature change, at least one of the resistances R1, R2, and R3 of the bridge 3000 shown in FIG. 6c may be replaced with a thermistor. The resistance change due to the temperature of the thermistor may cope with the resistance change of the strain gauge 450 due to the temperature by the thermal expansion of the display panel 200A on which the strain gauge 450 has been formed. Consequently, the change of the output voltage Vo due to the temperature can be reduced.

Figure 6F:
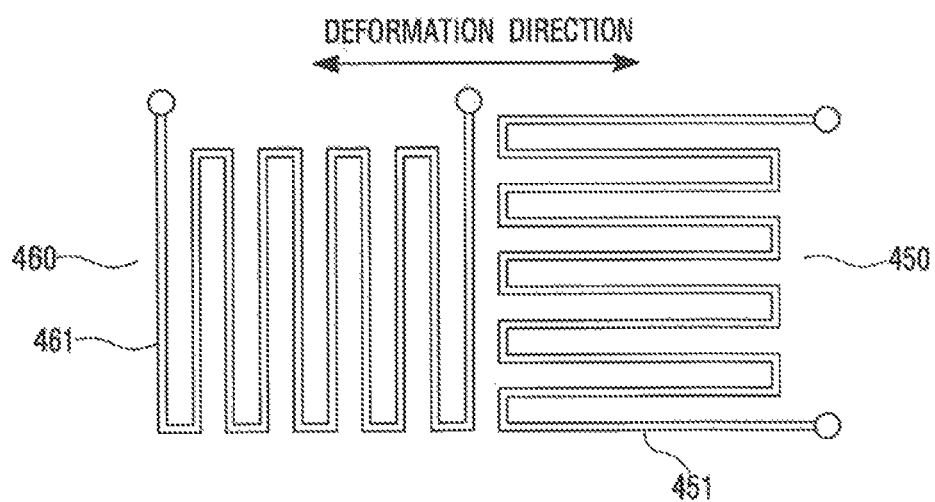

Also, the effect of the temperature change can be minimized by using two gauges. For example, as shown in FIG. 6f, the strain gauge 450 is deformed in the horizontal direction, the traces 451 of the strain gauge 450 may be arranged in the horizontal direction parallel to the deformation direction, and traces 461 of a dummy gauge 460 may be arranged in a vertical direction perpendicular to the deformation direction. Here, the deformation affects the strain gauge 450 and hardly affects the dummy gauge 460. However, the temperature has the same effect on both the strain gauge 450 and the dummy gauge 460. Therefore, the temperature change is applied equally to the two gauges, so that a ratio between the normal resistances $R_G$ of the two gauges does not change. Here, when the two gauges share an output node of the Wheatstone bridge, that is to say, when the two gauges are R1 and R2 or R3 and R4 of FIG. 6b, the output voltage Vo of the bridge 3000 does not change either, the effect of the temperature change can be minimized.

Figure 6G:
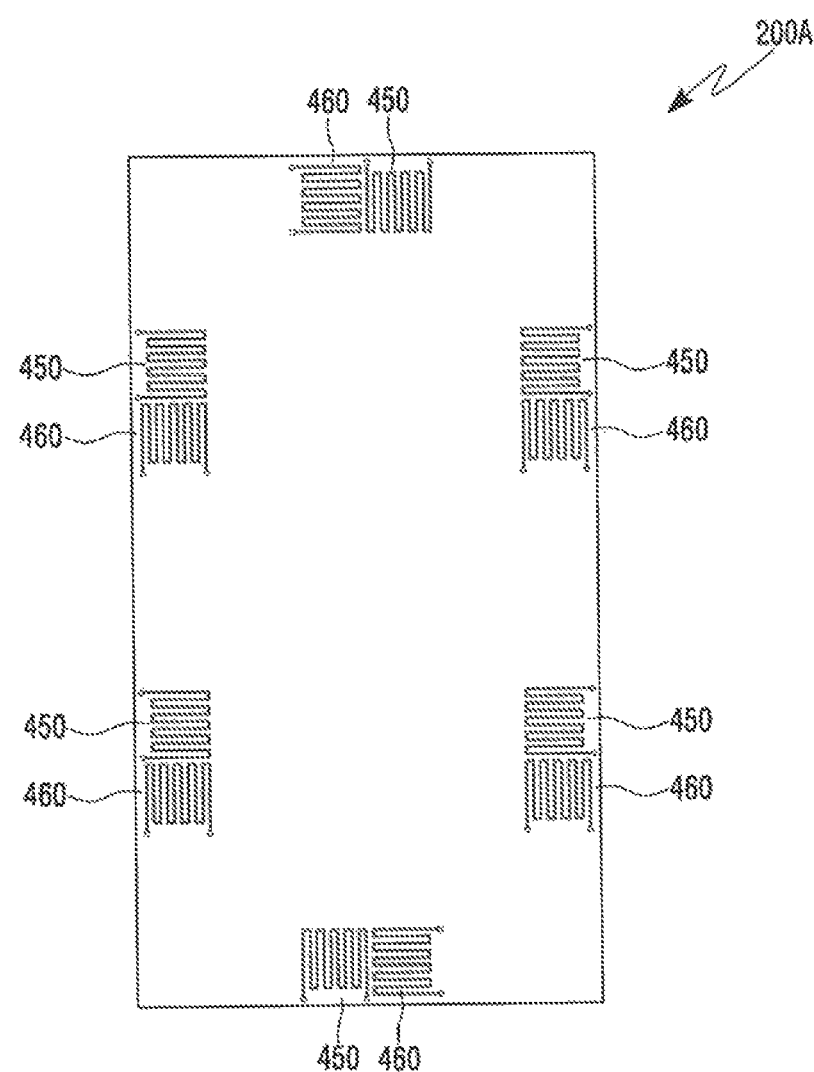
FIGS. 6g to 6i are rear views of the display panel in which the force sensor of the touch input device according to the embodiment of the present invention has been formed.
Figure 6H:
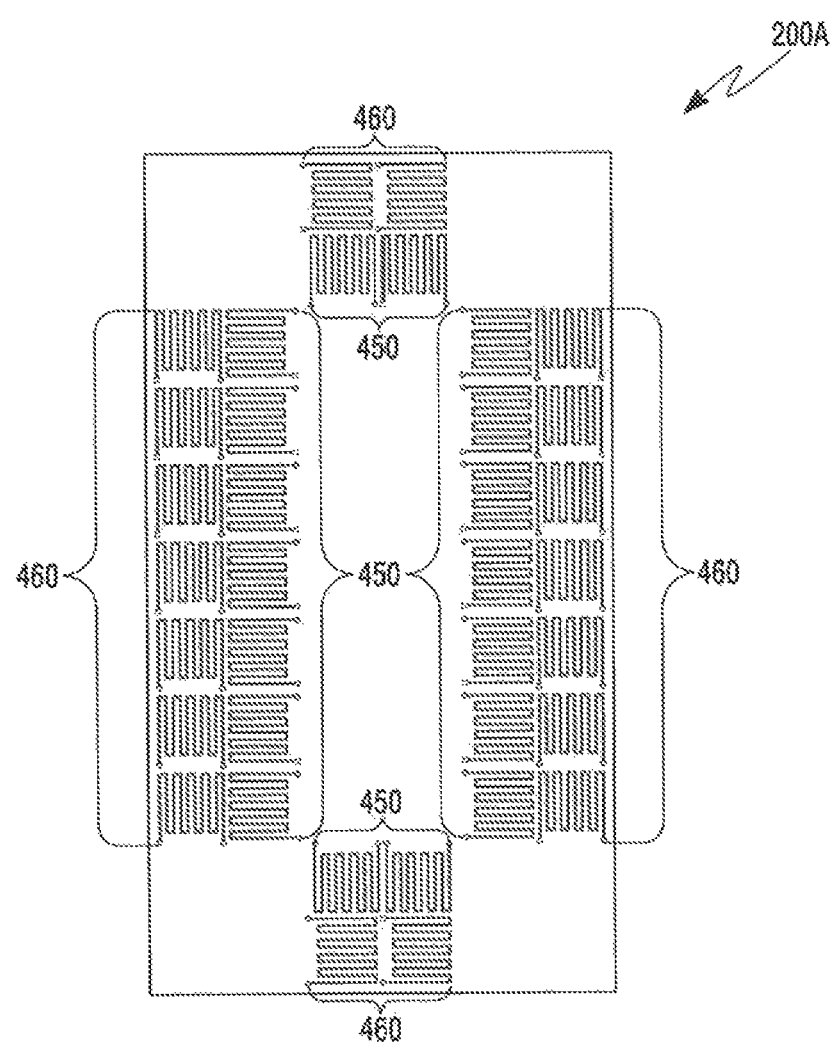
Figure 6I:
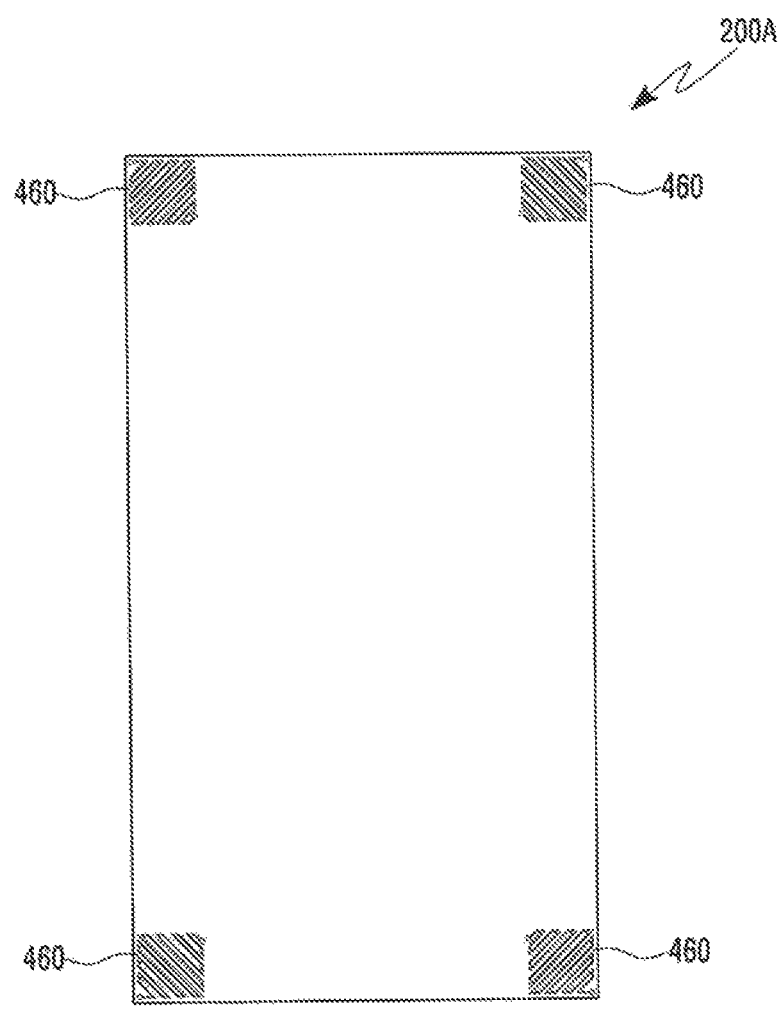

FIGS. 6g to 6i are rear views of the display panel in which the force sensor of the touch input device according to the embodiment of the present invention has been formed.

Since it is preferable that the trace 451 of the strain gauge 450 should be arranged in a direction parallel to the deformation direction, the trace 451 of the strain gauge 450 may be, as shown in FIG. 6g, arranged in the edge region of the display panel 200A in a direction perpendicular to the border of the display panel 200A. More specifically, since the border of the display panel 200A is fixed, when a force is applied to the display panel 200A, the biggest deformation may occur in a direction parallel to a straight line connecting the center of the display panel 200A with the position to which the force is applied. Therefore, it is preferable that the trace 451 of the strain gauge 450 should be arranged in a direction parallel to a straight line connecting the position where the strain gauge 450 is disposed with the center of the display panel 200A.

In the meantime, since it is preferable that the trace 461 of the dummy gauge 460 should be arranged in a direction perpendicular to the deformation direction, the trace 461 of the dummy gauge 460 may be, as shown in FIG. 6g, arranged in the edge region of the display panel 200A in a direction parallel to the border of the display panel 200A. More specifically, since the border of the display panel 200A is fixed, when a force is applied to the display panel 200A, the smallest deformation may occur in a direction perpendicular to a straight line connecting the center of the display panel 200A with the position to which the force is applied. Therefore, it is preferable that the trace 461 of the dummy gauge 460 should be arranged in a direction perpendicular to a straight line connecting the position where the dummy gauge 460 is disposed with the center of the display panel 200A.

Here, as shown in FIG. 6g, the strain gauge 450 and the dummy gauge 460 consisting of a pair with each other may be disposed adjacent to each other. In this case, the effect of the temperature change can be more minimized because the temperature difference between the adjacent positions may not be large.

Also, for example, as shown in FIG. 6h, a plurality of the dummy gauges 460 having the traces 461 arranged in a direction parallel to the border of the display panel 200A may be disposed along the border of the display panel 200A. In this case, since the edge region of the display panel 200A has a very small deformation amount caused by the force, the dummy gauge 460 disposed in the edge region of the display panel 200A may be more effective for compensating for the effect of the temperature change. Also, for example, as shown in FIG. 6i, the dummy gauge 460 may be disposed in four corner regions of the display panel 200A, which has the smallest deformation amount. The trace of the dummy gauge 460 may be arranged in a direction perpendicular to a direction in which the deformation amount is the largest.

Hereafter, a display process of forming the strain gauge 450 on the bottom surface of the second substrate layer 283 shown in FIG. 4b will be described. A display process of forming the strain gauge 450 on the bottom surface of the second substrate layer 262 shown in FIG. 4a will be replaced with the following description. Here, it should be noted that the method for forming the strain gauge 450 shown in FIGS. 7a to 7d and FIGS. 8 to 14 is not limited to the bottom surface of the second substrate layer 262 shown in FIG. 4a or the bottom surface of the second substrate layer 283 shown in FIG. 4b. The method for forming the strain gauge 450 shown in FIGS. 7a to 7d and FIGS. 8 to 14 can be applied not only to the top surface or bottom surface of the first substrate layer 261 shown in FIG. 4a but also to the top surface or bottom surface of the first substrate layer 281 as it is.

FIGS. 7a to 7d are views showing a process of forming the strain gauge on a side of the display panel 200A in the touch input device according to the embodiment of the present invention.

Figure 7A:
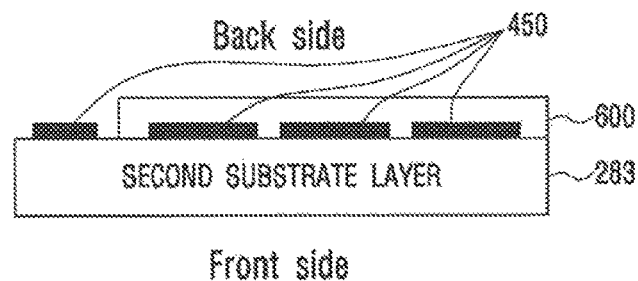
FIGS. 7a to 7d are views showing a process of forming the strain gauge on a bottom surface of the display panel in the touch input device according to the embodiment of the present invention.

First, as shown in FIG. 7a, the second substrate layer 283 is inverted such that the bottom surface of the second substrate layer 283 faces upward and the strain gauge 450 is formed on the bottom surface of the second substrate layer 283, which faces upward. There are a variety of methods for forming the strain gauge 450. Several of the methods will be described.

Firstly, the strain gauge is formed by photolithography. First, the second substrate layer 283 is inverted. Here, a cleaning process of removing impurities covered on the surface of the second substrate layer 283 by using de-ionized water may be performed in advance. Then, a deposition material which is available as the strain gauge 450 is deposited on the bottom surface of the second substrate layer 283 by physical vapor deposition or chemical vapor deposition. The deposition material may be a metallic material such as Al, Mo, AlNd, MoTi, ITO, etc., or may be a material which is used in a semiconductor process such as doped single crystal silicon, etc. Next, through use of a process such as spin coating, slit die coating, screen printing, dry film resist (DFR) laminating, etc., a photoresist is coated on the bottom surface of the second substrate layer 283. The bottom surface of the second substrate layer 283 to which the photoresist has been applied is exposed to light by using ultraviolet (UV). Here, if a positive photoresist (positive PR) is used at this time, the portion exposed to light is washed out by a developer due to chemical decomposition after being exposed to light. If a negative PR is used, the portion exposed to light is chemically combined with the light and a portion which has not been exposed to light is washed out by a developer after being exposed to light. The pattern exposed to light is developed by using a developer, and the photoresist of the portion exposed to light is removed. Here, an aqueous solution mixed with alkali such as sodium sulfite, sodium carbonate, etc., may be used as the developer. Next, a circuit is formed by melting the pattern of the film of the strain gauge 450 by means of chloride mixed gas, hydrofluoric acid, acetic acid, etc. Then, a pattern is formed by an etching process, and the photoresist remaining on the surface of the second substrate layer 283 is removed. Lastly, impurities on the surface of the second substrate layer 283 are removed by using de-ionized water again. As a result, the strain gauge 450 is formed. Through this method, a clean line of the pattern can be obtained and a fine pattern can be formed.

Secondly, the strain gauge is formed by using an etching resist. The etching resist refers to a film applied with the intention of partially preventing the etching or the material of the film. Organic matter, inorganic matter, metal, etc., can be used as the etching resist. First, impurities on the surface of the second substrate layer 283 are removed by using de-ionized water. Then, a deposition material which is available as the strain gauge 450 is deposited on the bottom surface of the second substrate layer 283 by physical vapor deposition or chemical vapor deposition. The deposition material may be Al, Mo, AlNd, MoTi, ITO, etc., or may be a material which is used in a semiconductor process such as doped single crystal silicon, etc. Then, the etching resist is coated on the second substrate layer 283 by screen printing, gravure coating inkjet coating, etc. After the etching resist is coated, a drying process is performed and etching process is performed. That is, the pattern portion of the strain gauge 450 deposited on the bottom surface of the second substrate layer 283 is melted by an etching solution such as chloride mixed gas, hydrofluoric acid, acetic acid, etc., so that a circuit is formed. Then, the etching resist remaining on the surface of the second substrate layer 283 is removed. This method does not need an exposure system, so that the strain gauge can be formed at a relatively low cost.

Thirdly, the strain gauge is formed by etching paste. When a deposition material is deposited on the bottom surface of the second substrate layer 283, the etching paste is coated on the second substrate layer 283 by using screen printing, gravure coating inkjet coating, etc. Then, in order to heighten the etch rate of the etching paste, the second substrate layer 283 is heated at a high temperature of 80 to 120° C. for approximately 5 to 10 minutes. Then, a cleaning process is performed, and thus, the strain gauge 450 is formed on the bottom surface of the second substrate layer 283. However, unlike this, after the heating process is performed, a process of completely drying the etching paste can be considered to be included. The third method has a simple process and a reduced material cost. Also, when the drying process is further included, a fine pattern can be formed.

Through the above-described method, when the strain gauge 450 is formed on the bottom surface of the second substrate layer 283, an insulator 600 is formed on the strain gauge 450. This functions to protect the strain gauge 450 formed on the bottom surface of the second substrate layer 283. The insulator 900 may be formed by the above-described method. Briefly describing, the insulator is deposited on the strain gauge 450 by physical vapor deposition or chemical vapor deposition, and the photoresist is coated and dried. Then, the exposure process is performed on the photoresist, and then the photoresist is etched. Lastly, a photoresist strip process of removing the remaining photoresist is performed, so that the strain gauge pattern is completed. Here, SiNx, SiOx, etc., may be used as the material of the insulator. Here, the insulator 600 may function as the light shielding layer. For example, the insulator colored black may be used. As such, when the insulator has the function of shielding the light, the pattern of the strain gauge 450 formed under the display panel 200A may not be visible to the user even without disposing a separate light shielding layer.

Figure 7B:
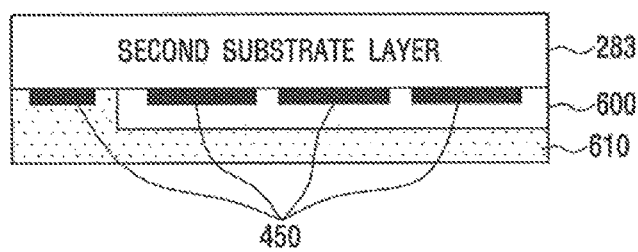

In the next place, in order to protect the pattern of the strain gauge 450 during the process, a protective layer 610 is formed. The protective layer 610 may be formed by coating or attaching. Here, for the purpose of protecting a component such as TFT, etc., which has a low hardness, it is desirable that the protective layer 610 should be made of a material having a hardness high enough to protect each layer. Then, the second substrate layer 283 is inverted again such that the top surface of the second substrate layer 283 faces upward. FIG. 7b shows that after the protective layer 610 is formed, the second substrate layer 283 is inverted into its original position.

Figure 7C:
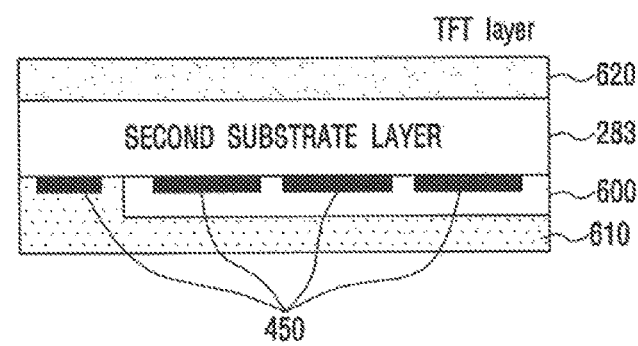

FIG. 7c shows that the configuration of the display panel 200A which is stacked on the top surface of the second substrate layer 283 is formed. Since FIG. 7c assumes the OLED panel, a TFT layer 620 is shown to be formed. The TFT layer 620 includes basic components included in the OLED panel (particularly, AM-OLED panel). That is, the TFT layer 920 may include a TFT electrode as well as the cathode, organic layer, and anode, which have been described above with regard to the OLED panel. Also, various elements (e.g., over coat (OC), passivation (PAS), inter-layer dielectric (ILD), gate insulator (GI), light shield (LS), or the like) for stacking these components may be formed. This may be formed by a variety of OLED panel forming processes.

Unlike this, in the case of the LCD panel, various elements including the liquid crystal layer may be substituted for the TFT layer 620 of FIG. 7c.

Figure 7D:
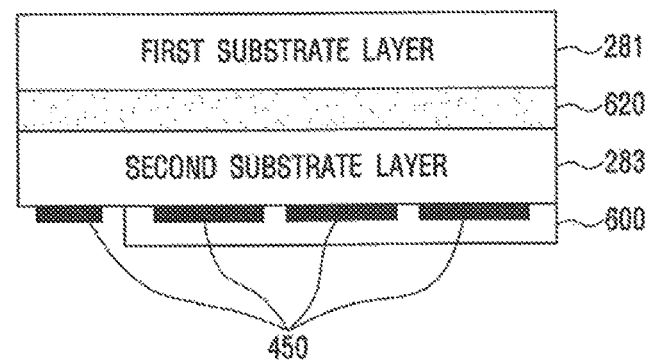

Lastly, as shown in FIG. 7d, when the first substrate layer 281 is formed on the TFT layer 620 and the protective layer 610 formed in FIG. 7b is chemically or physically removed, the display panel 200A having the strain gauge 450 formed on the bottom surface thereof is manufactured.

In the above manner, the strain gauge 450 is formed on the bottom surface of the display panel 200A using the LCD panel or OLED panel, so that the touch input device 1000 capable of detecting the touch force can be thinner and the manufacturing cost of the touch input device 1000 can be reduced.

Also, the method for forming the strain gauge 450 on the second substrate layer 283 includes a Gravure printing method (or roller printing method).

The Gravure printing method includes a Gravure offset printing method and a Reverse offset printing method. The Gravure offset printing method includes a roll type printing method and a sheet type printing method. Hereafter, the roll type printing method and the sheet type printing method which are included in the Gravure offset printing method, and the Reverse offset printing method will be described in turn with reference to the drawings.

Figure 8:
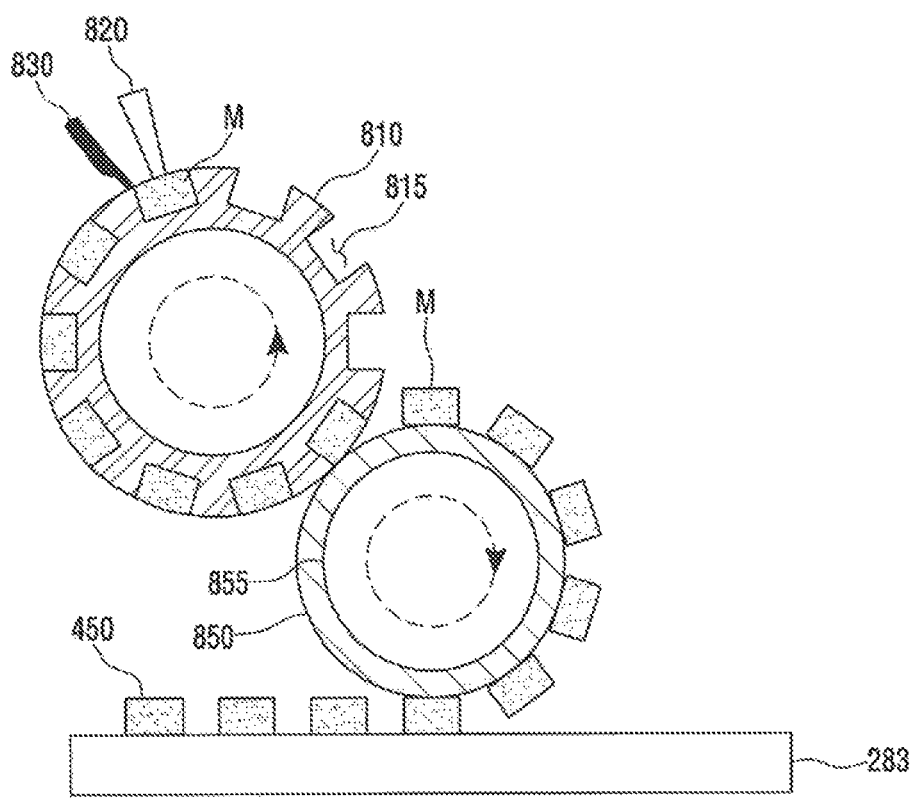
FIG. 8 is a view for describing a method for forming the strain gauge on a second substrate layer by using a roll type printing method.

FIG. 8 is a view for describing a method for forming the strain gauge 450 on the second substrate layer 283 by using the roll type printing method.

Referring to FIG. 8, a strain gauge constituent material is injected into a groove 815 formed in a Gravure roll 810 by using an injection unit 820. Here, the strain gauge constituent material is filled in the groove 815 by using a blade 830. Here, the shape of the groove 815 corresponds to the shape of the strain gauge 450 to be printed on the bottom surface of the inverted second substrate layer 283. The blade 830 functions to remove the excess amount of the strain gauge constituent material overflowing the groove 815 and to push the strain gauge constituent material into the groove 815. The injection unit 820 and the blade 830 are fixed and mounted around the Gravure roll 810. The Gravure roll 810 rotates counterclockwise.

The strain gauge pattern M filled in the groove 815 of the Gravure roll 810 is transferred to a blanket 855 of a transfer roll 850 by rotating the Gravure roll 810. The rotation direction of the transfer roll 850 is opposite to the rotation direction of the Gravure roll 810. The blanket 855 may be made of a resin having a predetermined viscosity, particularly, silicon-based resin.

The transfer roll 850 is rotated and the strain gauge pattern M transferred to the blanket 855 of the transfer roll 850 is transferred to the second substrate layer 283. As a result, the strain gauge 450 may be formed on the bottom surface of the inverted second substrate layer 283.

Figure 9:
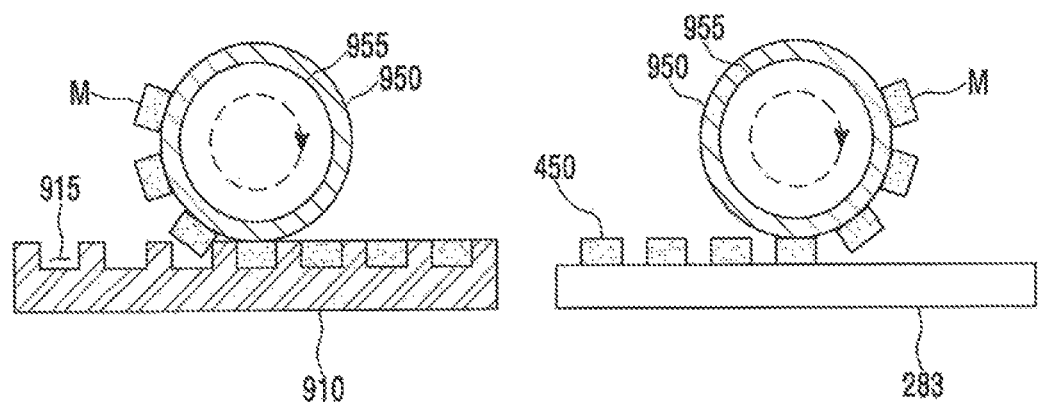
FIG. 9 is a view for describing a method for forming the strain gauge on the second substrate layer by using a sheet type printing method.
Figure 10:
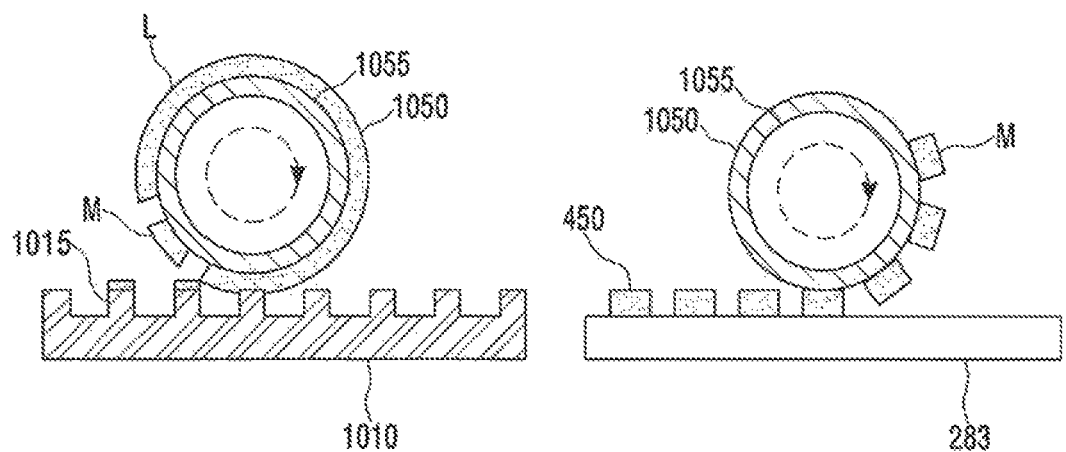

The roll type printing method shown in FIG. 8 has a better productivity than those of the methods shown in FIGS. 9 and 10, and thus, is advantageous for forming the strain gauge having a simple shape such as a stripe-shaped strain gauge or a mesh-shaped strain gauge.

FIG. 9 is a view for describing a method for forming the strain gauge 450 on the second substrate layer 283 by using the sheet type printing method.

Referring to FIG. 9, the strain gauge constituent material is injected into a groove 915 of a Cliche plate 910, and the strain gauge pattern M is formed in the groove 915.

A transfer roll 950 including a blanket 955 is rotated on the Cliche plate 910, and the strain gauge pattern M is transferred to the blanket 955. Here, the transfer roll 950 is only rotated in a fixed state and the Cliche plate 910 can move under the transfer roll 950. Alternatively, the Cliche plate 910 is fixed and the transfer roll 950 can move with the rotation on the Cliche plate 910. The shape of the groove 915 corresponds to the shape of the strain gauge 450 to be printed on the bottom surface of the inverted second substrate layer 283. The blanket 955 may be made of a resin having a predetermined viscosity, particularly, silicon-based resin.

When the strain gauge pattern M is transferred to the blanket 955 of the transfer roll 950, the transfer roll 950 is rotated on the second substrate layer 283 and the strain gauge pattern M is transferred to the bottom surface of the second substrate layer 283. As a result, the strain gauge pattern M is can be formed on the bottom surface of the inverted second substrate layer 283. Here, the transfer roll 950 is only rotated in a fixed state and the second substrate layer 283 can move under the transfer roll 950. Alternatively, the second substrate layer 283 is fixed and the transfer roll 950 can move with the rotation on the second substrate layer 283.

The sheet type printing method shown in FIG. 9 has a higher printing precision than those of the methods shown in FIGS. 8 and 10 and spends a smaller amount of the strain gauge constituent material (e.g., ink) than those of the methods shown in FIGS. 8 and 10.

FIG. 8 is a view for describing a method for forming the strain gauge 450 on the second substrate layer 283 by using the reverse offset printing method.

Referring to FIG. 10, a transfer roll 1050 including a blanket 1055 is rotated on a Cliche plate 1010 including a protrusion 1015, and the strain gauge pattern M is processed from a strain gauge constituent material layer L coated on the entire outer surface of the blanket 1055. A portion of the strain gauge constituent material layer L coated on the entire outer surface of the blanket 1055, which contacts the protrusion 1015, is transferred to the protrusion 1015 and the other portions, which do not contact the protrusion 1015, remain in the blanket 1055 as they are. Therefore, a predetermined strain gauge pattern M of which the portions has been removed by the protrusion 1015 may be formed on the blanket 1055. Here, the transfer roll 1050 is only rotated in a fixed state and the Cliche plate 1010 can move under the transfer roll 1050. Alternatively, the Cliche plate 1010 is fixed and the transfer roll 1050 can move with the rotation on the Cliche plate 1010. The shape of the protrusion 1015 corresponds to the shape of the strain gauge 450 to be printed on the bottom surface of the inverted second substrate layer 283. The blanket 1055 may be made of a resin having a predetermined viscosity, particularly, silicon-based resin.

When the strain gauge pattern M is processed on the blanket 1055 of the transfer roll 1050, the transfer roll 1050 is rotated on the second substrate layer 283, and the strain gauge pattern M is transferred to the bottom surface of the second substrate layer 283. As a result, the strain gauge pattern M is can be formed on the bottom surface of the inverted second substrate layer 283. Here, the transfer roll 1050 is only rotated in a fixed state and the second substrate layer 283 can move under the transfer roll 1050. Alternatively, the second substrate layer 283 is fixed and the transfer roll 1050 can move with the rotation on the second substrate layer 283.

Compared to the methods shown in FIGS. 8 to 9, the reverse offset printing method shown in FIG. 10 is advantageous for forming the large area strain gauge.

Through use of the Gravure printing method shown in FIGS. 8 to 10, the strain gauge 450 can be directly printed and formed on the second substrate layer 283. Although the Gravure printing method has a somewhat lower resolution than the resolution of the above-described photolithography, etching resist method, and etching paste method, the strain gauge formation process in the Gravure printing method is simpler than those of the above-described methods, and the Gravure printing method has a better productivity.

Also, the strain gauge 450 may be formed on the second substrate layer 283 by the inkjet printing method.

The inkjet printing method means that a droplet (diameter less than 30 μm), i.e., the constituent material of the strain gauge 450 is discharged and then the strain gauge 450 is patterned on the second substrate layer 283.

The inkjet printing method is suitable for implementing a complicated shape in a small volume in a non-contact manner. The inkjet printing method has a simple process, a reduced facility cost, and a reduced manufacturing cost. The inkjet printing method has a low environmental load and does not waste raw material because the material is accumulated at a desired pattern position and thus there is no material loss in principle. Also, like photolithography, the inkjet printing method does not require a process such as development and etching, etc., so that the characteristics of the substrate or material are not degraded by chemical effects. Also, since the inkjet printing method is performed in a non-contact manner, devices are not damaged by contact. A substrate having unevenness can be also patterned. When the printing is performed in an on-demand manner, the pattern shape can be directly edited and changed by a computer.

The inkjet printing method is divided into a continuous manner in which the droplet is continuously discharged and an on-demand manner in which the droplet is selectively discharged. The continuous manner is mainly used in low resolution marking because the continuous manner generally requires large devices and has low print quality, so that the continuous manner is not suitable for colorization. The on-demand manner is used for high resolution patterning.

The on-demand inkjet printing method includes a piezo method and a bubble jet method (thermal method). In the piezo method, the volume is changed by replacing an ink chamber with a piezoelectric element (which is deformed when a voltage is applied), and when a pressure is applied to the ink within the ink chamber, the ink is discharged through a nozzle. In the bubble jet method, bubbles are instantaneously generated by applying heat to the ink, and then the ink is discharged by the pressure. The bubble jet method is the most suitable for an office because it is easy to miniaturize and densify the device and the cost of the head is low. However, the head has a short durability life due to the heat application and the available ink is limited because the effect of the boiling point of solvent or heat damage to the ink material is inevitable. In comparison with this, in the piezo method, the densification and head cost are worse than those of the bubble jet method. However, the piezo method has an excellent durability life of the head and excellent flexibility of the ink because no heat is applied to the ink. Therefore, the piezo method is more suitable for commercial printing, industrial printing, and device manufacture as well as offices.

Figure 11:
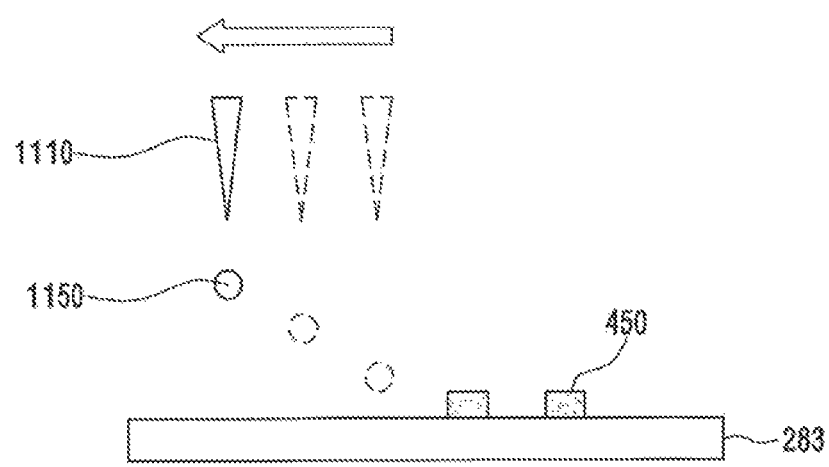
FIG. 11 is a view for describing a method for forming the strain gauge on the second substrate layer by using an inkjet printing method.

FIG. 11 is a view for describing a method for forming the strain gauge 450 on the second substrate layer 283 by using an inkjet printing method.

Referring to FIG. 11, a fine droplet 1150 discharged through a nozzle 1110 flows in the air and is attached to the surface of the second substrate layer 283, and the solvent is dried and a solid component is fixed, so that the strain gauge 450 is formed.

The size of the droplet 1150 is several to scores of p1 and the diameter of the droplet 1150 is about 10 μm. The droplet 1150 collides with and is attached to one side of the second substrate layer 283 and then forms a predetermined pattern. The key factor for determining the resolution of the formed pattern is the size and wettability of the droplet 1150. The droplet 1150 dropped onto the second substrate layer 283 spreads on the second substrate layer 283 in a two dimensional way and finally becomes the strain gauge 450 having a size larger than that of the droplet 1150. The spread of the droplet 1150 depends on the kinetic energy at the time of colliding with the second substrate layer 283 and on the wettability of the solvent. In the case of very fine droplet 1150, the kinetic energy has a very small effect and the wettability has a dominant effect. When the droplet 1150 has a lower wettability and a greater wetting angle, the spread of the droplet 1150 is restricted, so that the fine strain gauge 450 can be printed. However, if the wetting angle is too large, the droplets 1150 bounce and gather, so that the strain gauge 450 may not be formed. Therefore, in order to obtain the high resolution strain gauge 450, it is necessary to control the solvent selection or the surface condition of the second substrate layer 283 so as to obtain an appropriate wetting angle. It is desirable that the wetting angle should be approximately 30 to 70 degrees. The solvent of the droplet 1150 attached to the second substrate layer 283 is evaporated and the strain gauge 450 is fixed. In this step, the drying rate is high because the size of the droplet 1150 is very small.

In addition, the method for forming the strain gauge 450 on the second substrate layer 283 includes a screen printing method.

Figure 12:
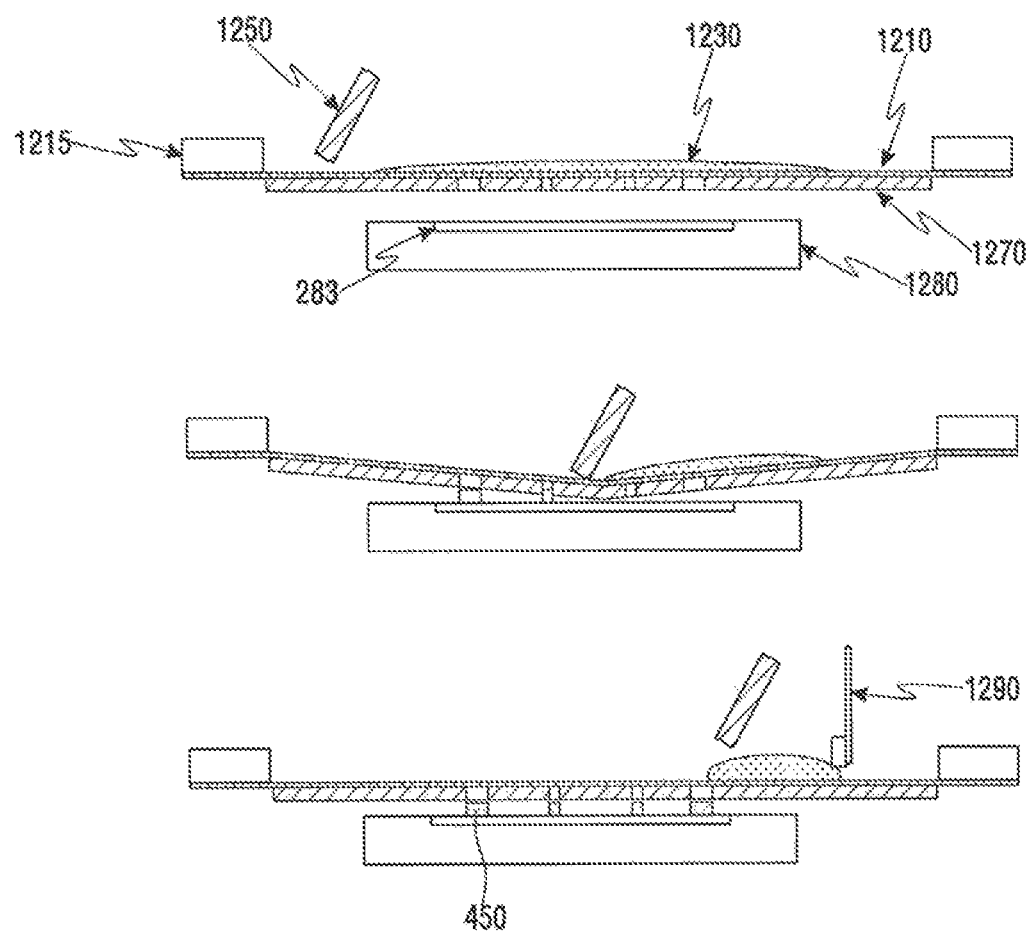
FIG. 12 is a view for describing a method for forming the strain gauge on the second substrate layer by using a screen printing method.

FIG. 12 is a view for describing a method for forming the strain gauge 450 on the second substrate layer 283 by using the screen printing method.

As with the inkjet printing method, the screen printing method has a low material loss.

Referring to FIG. 12, a paste 1230, i.e., the strain gauge constituent material, is placed on a screen 1210 pulled with a strong tension and a squeegee 1250 is moved while being pressed down. Then, the paste 1230 is pushed and transferred to the surface of the second substrate layer 183 through a mesh of the screen 1210.

In FIG. 12, a reference numeral 1215 represents a screen frame. A reference numeral 1270 represents plastic emulsion. A reference numeral 1280 represents Nest which is mounted on the second substrate layer 283. A reference numeral 1290 represents a flood blade.

The mesh of the screen 1210 may be made of stainless metal for the purpose of the fine strain gauge 450. Since the paste 1230 needs an appropriate viscosity, the paste 1230 may be obtained by dispersing a resin or solvent in a basic material such as metal powder or semiconductor, etc. According to the screen printing method, while an interval of several millimeters is maintained between the screen 1210 and the second substrate layer 283, at the moment when the squeegee 1250 passes through the interval, the screen 1210 comes in contact with the second substrate layer 283 and the paste 1230 is transferred. Though the screen printing method is a contact type printing method, there is little effect of the second substrate layer 283 through the contact.

The screen printing method is performed through four basic processes such as rolling, discharging, plate separation, and leveling. The rolling means that the paste 1230 is rotated forward on the screen 1210 by the moving squeegee 1250. The rolling functions to stabilize the viscosity of the paste 1230 constantly and is an important process for obtaining a uniform thin film. The discharging means that the paste 1230 is pushed by the squeegee 1250, passes through between the screen 1210 and the mesh, and is pushed to the surface of the second substrate layer 283. The discharge force depends on the moving speed of the squeegee 1250 and an angle formed by the squeegee 1250 with the screen 1210. The less the angle of the squeegee 1250 is and the less the moving speed is, the greater the discharge force is. The plate separation means that the screen 1210 is separated from the second substrate layer 283 after the paste 1230 reaches the surface of the second substrate layer 283. The plate separation is a very important process for determining the resolution and continuous printability. The paste 1230 which has passed through the screen 1210 and has reached the second substrate layer 283 is spread with the fixing to the screen 1210 and the second substrate layer 283. Therefore, it is preferable that the paste 1230 should be immediately separated from the screen 1210. For this purpose, the screen 1210 needs to be pulled with a high tension. The paste 1230 which has been discharged on the second substrate layer 283 and has been plate-separated has fluidity. Therefore, the strain gauge 450 is likely to change, so that a mark or pin hole, etc., is generated in the mesh. As time goes by, the viscosity is increased due to the evaporation of the solvent, etc., and the fluidity is lost. Eventually, the strain gauge 450 is completed. This process is referred to as the leveling.

The printing condition of the strain gauge 450 by the screen printing method depends on the following four factors. ① clearance for stable plate separation ② the angle of the squeegee 1250 for discharging the paste 1230 ③ the speed of the squeegee 1250, which affects the discharge of the paste 1230 and the plate separation speed, and ④ the pressure of the squeegee 1250 which scrapes the paste 1230 on the screen 1210.

The thickness of the strain gauge 450 which is printed is determined by a discharge amount obtained through multiplication of the mesh thickness of the screen 1210 and an opening ratio. The accuracy of the strain gauge 450 depends on the fineness of the mesh. For the purpose of rapid plate separation, the screen 1210 needs to be pulled with a strong tension. However, when a fine patterning is performed by using the screen 1210 having a thin mesh, limit of a dimension stability which the screen 1210 having a thin mesh can endure may be exceeded. However, by using the screen 1210 to which a wire of about 16 µm is applied, the strain gauge 450 having a line width of less than 20 µm can be patterned.

In addition, the method for forming the strain gauge 450 on the second substrate layer 283 includes a flexographic printing method.

Figure 13:
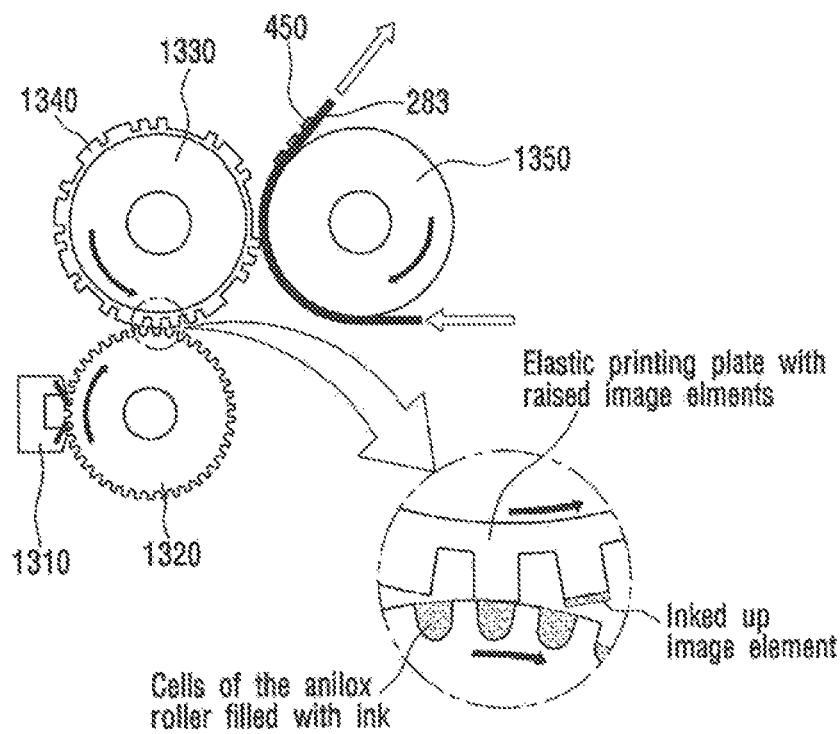
FIG. 13 is a view for describing a method for forming the strain gauge on the second substrate layer by using a flexographic printing method.

FIG. 13 is a view for describing a method for forming the strain gauge 450 on the second substrate layer 283 by using a flexographic printing method.

Referring to FIG. 13, the ink, i.e., the strain gauge constituent material which is supplied from a supplier 1310 is applied on an Anilox roller 1320 having a uniform grating, and is uniformly spread on the surface of the Anilox roller 1320 by using a doctor blade (not shown). Next, the ink spread on the surface of the Anilox roller 1320 is transferred in an embossed pattern to a soft printing substrate 1340 mounted on a printing cylinder 1330. Then, the ink transferred to the soft printing substrate 1340 is printed on the surface of the second substrate layer 283 which moves by the rotation of a hard printing roll 1350. As a result, the strain gauge 450 is formed.

Regarding the flexographic printing method shown in FIG. 13, the thickness of the strain gauge 450 which is printed on the second substrate layer 283 can be controlled by a pore size and density of the Anilox roller 1320, so that it is possible to form a uniform thin film. Also, the location or range in which the ink is applied can be precisely adjusted by changing the shape of the patterned strain gauge 450. Therefore, the flexographic printing method can be also applied to printing using a flexible substrate.

The flexographic printing method is used to apply an alignment film of the LCD. A polyimide alignment film having a uniform thickness is formed by the flexographic printing method and a rubbing method is used. Meanwhile, as the size of the second substrate layer 283 is increased, the second substrate layer 283 after the six generation (1500× 1800) may have a form in which the printing roll 1350 moves.

Further, the method for forming the strain gauge 450 on the second substrate layer 283 includes a transfer printing method. The transfer printing method includes a laser transfer printing method and a thermal transfer printing method.

Figure 14:
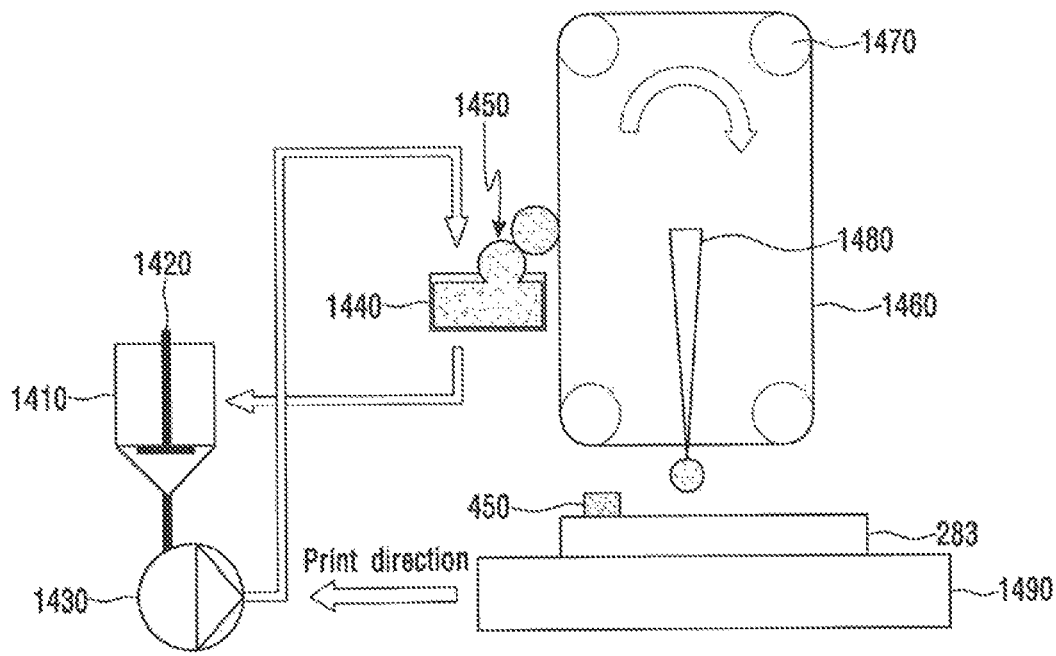
FIG. 14 is a view for describing a method for forming the strain gauge on the second substrate layer by using a transfer printing method.
Figure 15A:
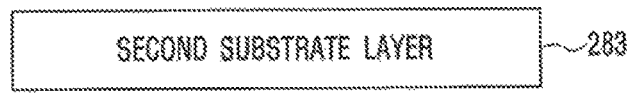
FIGS. 15a to 15d are views showing another process of forming the strain gauge on the bottom surface of the display panel in the touch input device according to the embodiment of the present invention.
Figure 15B:
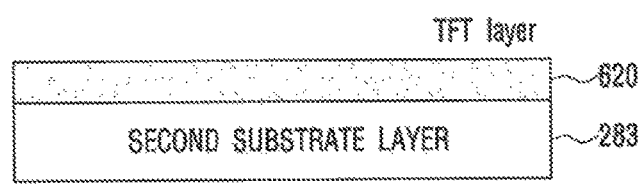
Figure 15C:
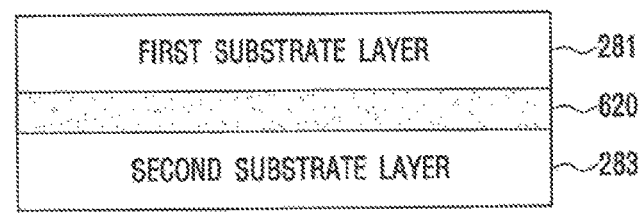
Figure 15D:
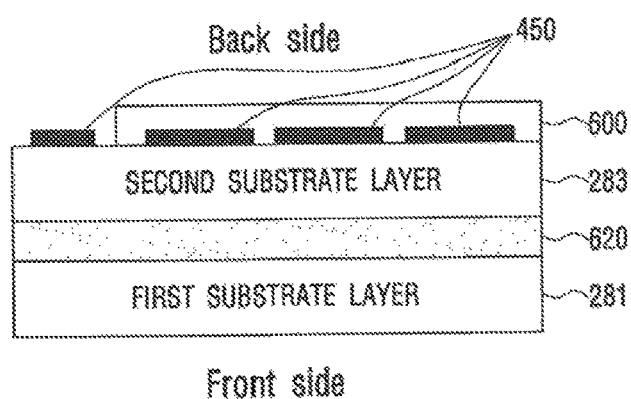

FIG. 14 is a view for describing a method for forming the strain gauge 450 on the second substrate layer 283 by using the laser transfer printing method.

Referring to FIG. 14, the ink, i.e., the strain gauge constituent material stored in a supplier 1410 is supplied to an ink station 1440 by a pump 1430. Here, the supplier 1410 may include a controller 1420 for controlling the viscosity and temperature of the ink.

The ink present in the ink station 1440 is coated on one side of a transparent endless belt 1460 by a roller 1450. Here, the transparent endless belt 1460 is rotated by a plurality of guide rollers 1470.

While the transparent endless belt 1460 is rotated by the guide roller 1470, laser 1480 is applied to the transparent endless belt 1460, so that the ink is transferred from the transparent endless belt 1460 to the surface of the second substrate layer 283. Through the control of the laser, predetermined ink is transferred to the second substrate layer 283 by heat generated by the laser and the pressure of the laser. The transferred ink becomes the strain gauge 450. Here, the second substrate layer 283 is delivered in a predetermined print direction by a handling system 1490.

Meanwhile, though not shown, the thermal transfer printing method is similar to the laser transfer printing method shown in FIG. 14. The thermal transfer printing method is that a heat radiating device that radiates high temperature heat is added to the transparent endless belt coated with the ink, and the strain gauge 450 having a predetermined pattern is formed on the surface of the second substrate layer 283.

Through the transfer printing method including the laser transfer printing method and the thermal transfer printing method, there is an advantage in that it is possible to very precisely form the strain gauge 450 transferred to the second substrate layer 283 such that the strain gauge 450 has an accuracy of about ±2.5 μm.

The foregoing has described the manufacturing process of the display panel 200A on which the strain gauge 450 has been formed. However, the order of the steps of the process may be changed or any one step of the process may be omitted. For example, in the steps of FIGS. 7a to 7d and 8 to 14, it has been described that, after the second substrate layer 283 is inverted first and the strain gauge 450 is formed on the bottom surface of the second substrate layer 283, the second substrate layer 283 is inverted back to its original position and the TFT layer 620 and the first substrate layer 281 are formed. However, the order thereof may be changed.

For instance, in the formation of the strain gauge 450 through use of the deposition process described in FIGS. 7a to 7d, when the deposition material is silicone, etc., a high temperature process condition is required. In this case, since the TFT layer 620 formed on the top surface of the second substrate layer 283 includes a metal layer, when the strain gauge 450 is formed after the TFT layer 620 is formed, the metal layer included in the TFT layer 620 may be damaged by the high temperature process condition. Therefore, in such a case, as described in FIGS. 7a to 7d, it is desirable that the strain gauge 450 is formed first on the bottom surface of the second substrate layer 283, and then the TFT layer 620 is formed.

However, if the composition of the strain gauge 450 is metal, it is desirable that the TFT layer 620 is formed and then the strain gauge 450 is formed. In the formation of the TFT layer 620, the high temperature process condition such as a silicon deposition, etc., is also required. Therefore, when the strain gauge 450 is formed first, the strain gauge 450 may be damaged in the formation of the TFT layer 620. Accordingly, in this case, it is desirable that the TFT layer 620 is formed first and then the strain gauge 450 is formed on the bottom surface of the second substrate layer 283. Specifically, as shown in FIGS. 15a to 15d, the TFT layer 620 is formed first on the top surface of the second substrate layer 283, and then the first substrate layer 281 is formed on the TFT layer 260. Then, the display panel 200A composed of the first substrate layer 281, the TFT layer 620, and the second substrate layer 283 is inverted such that the bottom surface of the second substrate layer 283 faces upward. Then, the strain gauge 450 can be formed by the above-described method on the bottom surface of the second substrate layer 283, which faces upward. Here, the strain gauge 450 may be also formed by inverting the display module 200 where even the first polarization layer 282 has been disposed on the display panel 200A.

Here, the description of FIGS. 15a to 15d has been provided by using FIGS. 7a to 7d for describing the method for forming the strain gauge 450 by the deposition process. However, there is no limitation to this. The method for forming the strain gauge 450 by other processes shown in FIGS. 8 to 14 can be also applied to the description of FIGS. 15a to 15d. That is to say, the second substrate layer 283, the TFT layer 620, and the first substrate layer 281 of the display panel 200A are all formed, and then the strain gauge 450 can be formed on the bottom surface of the second substrate layer 283.

Further, when the display panel 200A further includes the light shielding layer, it is possible that the strain gauge 450 is formed on the bottom surface of the second substrate layer 283, which faces upward, and then the light shielding layer is disposed under the second substrate layer 283 on which the strain gauge 450 has been formed which faces upward. Alternatively, it is possible that the light shielding layer is disposed on the bottom surface of the second substrate layer 283, which faces upward, and then the strain gauge 450 is formed on the bottom surface of the light shielding layer, which faces upward. Likewise, it is possible that the strain gauge 450 and the light shielding layer are disposed under the second substrate layer 283, and then the second substrate layer 283 is inverted, so that the TFT layer 620 and the first substrate layer 281 are formed. Alternatively, it is possible that the panel composed of the second substrate layer 283, the TFT layer 620, and the first substrate layer 281 is inverted, so that the strain gauge 450 and the light shielding layer are disposed under the second substrate layer 283.

Also, the step of applying the light shielding layer such as black ink on the bottom surface of the second substrate layer 283 may be performed immediately before the step of forming the strain gauge 450 on the bottom surface of the second substrate layer 283, which faces upward.

Also, as described in FIG. 4b, when the strain gauge 450 is formed on the bottom surface of the third substrate layer (not shown) disposed under the second substrate layer 283, similarly to the method described in FIGS. 7a to 7d, after the third substrate layer is inverted first and the strain gauge 450 is formed on the bottom surface of the third substrate layer, which faces upward, the third substrate layer is inverted into its original position. Then, the panel composed of the second substrate layer 283, the TFT layer 620, and the first substrate layer 281 is disposed on the third substrate layer. Also, similarly to the method described in FIGS. 15a to 15d, the display panel 200A composed of the first substrate layer 281, the TFT layer 620, the second substrate layer 283, and the third substrate layer is inverted, so that the strain gauge 450 can be formed on the bottom surface of the third substrate layer, which faces upward. Also, when the display panel 200A further includes the light shielding layer, it is possible that the strain gauge 450 is formed on the bottom surface of the third substrate layer, which faces upward, and then the light shielding layer is disposed under the third substrate layer on which the strain gauge 450 has been formed which faces upward. Alternatively, it is possible that the light shielding layer is disposed on the bottom surface of the third substrate layer, which faces upward, and then the strain gauge 450 is formed on the bottom surface of the light shielding layer, which faces upward.

Also, it is possible that the strain gauge 450 is formed on the bottom surface of the third substrate layer, which faces upward, and the third substrate layer on which the strain gauge 450 has been formed is inverted, and then the panel composed of the light shielding layer, the second substrate layer 283, the TFT layer 620, and the first substrate layer 281 is disposed on the inverted third substrate layer. Also, it is possible that the strain gauge 450 is formed on the bottom surface of the third substrate layer, which faces upward, and the third substrate layer on which the strain gauge 450 has been formed is inverted, and the light shielding layer is disposed on the inverted third substrate layer, and then the panel composed of the second substrate layer 283, the TFT layer 620, and the first substrate layer 281 is disposed on the light shielding layer. Also, it is possible that the panel composed of the second substrate layer 283, the TFT layer 620, and the first substrate layer 281 is inverted, the light shielding layer is disposed under the second substrate layer 283 which faces upward, and the third substrate layer is disposed under the light shielding layer which faces upward, and then the strain gauge 450 is formed on the bottom surface of the third substrate layer, which faces upward.

The features, structures and effects and the like described in the embodiments are included in one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A touch input device capable of detecting a touch force, the touch input device comprising:
    a display panel comprising a first substrate layer, a second substrate layer which is disposed under the first substrate layer, a liquid crystal layer or an organic material layer which is disposed between the first substrate layer and the second substrate layer, a third substrate layer which is disposed under the second substrate layer, and a light shielding layer which is disposed under the third substrate layer; and
    a strain gauge which is formed on a bottom surface of the light shielding layer,
    wherein the touch force is detected on the basis of a change of a resistance value of the strain gauge,
    wherein the strain gauge includes a first strain gauge having a first trace and a second strain gauge having a second trace, the first trace and the second trace being independent of one another, and
    wherein a direction of the first trace of the first strain gauge is different than a direction of the second trace of the second strain gauge.

2. The touch input device of claim 1, wherein the third substrate layer is relatively less bent than the first substrate layer, the liquid crystal layer or the organic material layer, and the second substrate layer.

3. The touch input device of claim 1, wherein the third substrate layer has a light shielding function.

4. The touch input device of claim 1, wherein the strain gauge is made of silicon.

5. The touch input device of claim 1, wherein the first trace alternates between extending in a first direction and extending in an opposite second direction,
    wherein the first strain gauge is arranged along an edge of the display panel, and
    wherein the first direction of the first trace and the second direction of the first trace are perpendicular to the edge along which the first strain gauge is arranged.

6. The touch input device of claim 1, wherein the light shielding layer is black ink.

7. The touch input device of claim 1, further comprising a touch sensor which detects a touch position, wherein the touch sensor is positioned on the display panel or is positioned inside the display panel.

8. The touch input device of claim 1, wherein the display panel is a Liquid Crystal Display (LCD) panel.

9. The touch input device of claim 1, wherein the display panel is an Organic Light Emitting Diode (OLED) display panel.

10. A touch input device capable of detecting a touch force, the touch input device comprising:
    a display panel comprising a first substrate layer, a second substrate layer which is disposed under the first substrate layer, a liquid crystal layer or an organic material layer which is disposed between the first substrate layer and the second substrate layer, a third substrate layer which is disposed under the second substrate layer, and a light shielding layer which is disposed under the third substrate layer; and
    a strain gauge which is formed on a bottom surface of the light shielding layer,
    wherein the touch force is detected on the basis of a change of a resistance value of the strain gauge, and
    wherein traces of the strain gauge are arranged in a direction parallel to a straight line connecting a position where the strain gauge is disposed with a center of the display panel.

11. The touch input device of claim 10, wherein the third substrate layer is relatively less bent than the first substrate layer, the liquid crystal layer or the organic material layer, and the second substrate layer.

12. The touch input device of claim 10, wherein the third substrate layer has a light shielding function.

13. The touch input device of claim 10, wherein the strain gauge is made of silicon.

14. The touch input device of claim 10, wherein a trace of the traces alternates between extending in a first direction and extending in an opposite second direction,
    wherein the strain gauge is arranged along an edge of the display panel, and
    wherein the first direction of the trace and the second direction of the trace are perpendicular to the edge along which the strain gauge is arranged.

15. The touch input device of claim 10, wherein the light shielding layer is black ink.

16. The touch input device of claim 10, further comprising a touch sensor which detects a touch position, wherein the touch sensor is positioned on the display panel or is positioned inside the display panel.

17. The touch input device of claim 10, wherein the display panel is a Liquid Crystal Display (LCD) panel.

18. The touch input device of claim 10, wherein the display panel is an Organic Light Emitting Diode (OLED) display panel.

* * * * *